(12) United States Patent
Yasuda et al.

(10) Patent No.: US 10,360,333 B1
(45) Date of Patent: Jul. 23, 2019

(54) CONFIGURATION MEMORY CIRCUIT

(71) Applicant: KABUSHIKI KAISHA TOSHIBA, Minato-ku (JP)

(72) Inventors: Shinichi Yasuda, Setagaya (JP); Masato Oda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/129,126

(22) Filed: Sep. 12, 2018

(30) Foreign Application Priority Data

Mar. 9, 2018 (JP) ................................ 2018-043238

(51) Int. Cl.
| | |
|---|---|
| *G06F 17/50* | (2006.01) |
| *G06F 7/12* | (2006.01) |
| *G11C 7/12* | (2006.01) |
| *G11C 8/08* | (2006.01) |
| *G11C 16/04* | (2006.01) |
| *G11C 8/14* | (2006.01) |
| *G11C 11/412* | (2006.01) |
| *G11C 7/18* | (2006.01) |

(52) U.S. Cl.
CPC ............ *G06F 17/5054* (2013.01); *G11C 7/12* (2013.01); *G11C 7/18* (2013.01); *G11C 8/08* (2013.01); *G11C 8/14* (2013.01); *G11C 11/412* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 6,759,895 B2 | 7/2004 | Takami | |
| 7,046,544 B1* | 5/2006 | Shimanek | G11C 11/412 |
| | | | 365/154 |
| 7,342,836 B2 | 3/2008 | Taheri et al. | |
| 7,760,537 B2 | 7/2010 | Urakawa | |
| 9,171,608 B2* | 10/2015 | Xie | G11C 11/412 |
| 9,466,358 B1* | 10/2016 | Arie | G06F 17/5077 |

(Continued)

FOREIGN PATENT DOCUMENTS

| | | |
|---|---|---|
| JP | 11-162172 | 6/1999 |
| JP | 2004-22736 | 1/2004 |

(Continued)

*Primary Examiner* — Crystal L Hammond
(74) *Attorney, Agent, or Firm* — Oblon, McClelland, Maier & Neustadt, L.L.P.

(57) ABSTRACT

A configuration memory circuit according to an embodiment includes: a first and second wirings; and a first to eighth transistors, the first and fourth transistors having a first-conductive-type, the second, third, fifth, and sixth transistors having a second-conductive-type, the first to third transistors being connected in series, the fourth to sixth transistors being connected in series, gates of the first and third transistors being connected to the first wiring, one of a source and a drain of the seventh transistor, and the first wiring, a gate of the second transistor being connected to a third wiring, gates of the fourth and sixth transistors being connected to the second wiring, one of a source and a drain of the eighth transistor, and the second wiring, a gate of the fifth transistor being connected to the third wiring, gates of the seventh and eighth transistors being connected to a fifth wiring.

12 Claims, 20 Drawing Sheets

(56) References Cited

U.S. PATENT DOCUMENTS

| | | | |
|---|---|---|---|
| 9,786,382 B1 * | 10/2017 | Matsumoto | G11C 17/16 |
| 10,037,290 B1 * | 7/2018 | Lee | G06F 13/1663 |
| 2006/0114020 A1 | 6/2006 | Taheri et al. | |
| 2006/0139056 A1 | 6/2006 | Madurawe | |
| 2008/0297195 A1 | 12/2008 | Urakawa | |
| 2013/0258782 A1 * | 10/2013 | Tatsumura | G11C 16/06 |
| | | | 365/185.17 |
| 2015/0357032 A1 * | 12/2015 | Tatsumura | H03K 19/1776 |
| | | | 365/72 |

FOREIGN PATENT DOCUMENTS

| | | |
|---|---|---|
| JP | 2008-515292 | 5/2008 |
| JP | 2009-9682 | 1/2009 |

\* cited by examiner

| COL | ROW | OUTPUT |
|-----|-----|--------|
| Vss | Vss | Vdd |
| Vss | Vdd | Vdd |
| Vdd | Vss | Vss |
| Vdd | Vdd | MAINTAINED |

FIG.15

CONFIGURATION MEMORY CIRCUIT

CROSS REFERENCE TO RELATED APPLICATIONS

This application is based upon and claims the benefit of priority from the prior Japanese Patent Application No. 2018-043238, filed on Mar. 9, 2018, the entire contents of which are incorporated herein by reference.

FIELD

Embodiments described herein relate generally to configuration memory circuits.

BACKGROUND

Recently, reconfigurable semiconductor integrated circuits such as field programmable gate arrays ("FPGAs") have attracted attention. The FPGAs use logic blocks provide basic logical information, and change connections among the logic blocks by using switch blocks. A user of an FPGA may achieve a desired logic function in this fashion. Data of the switch blocks for switching the logical information and the connections of the logic blocks are stored in a configuration memory, and the arbitrary logic function is achieved based on the data. The configuration memory is mainly used in two kinds of circuits. One is a multiplexer circuit ("MUX circuit") for selecting data for changing wiring line connections, and the other is a look-up table circuit ("LUT circuit") for providing logic data for achieving a desired logic.

The configuration memory may include SRAM cells. However, the SRAM cells may cause soft errors due to collision of high-energy particles or noise. If soft errors occur in the configuration memory of the FPGA, circuit information in the FPGA may be rewritten.

If nonvolatile memory cells are used in the configuration memory, the problem of soft errors may be avoided. For example, if flash memory cells or anti-fuse elements are used, the problem of soft errors may be avoided or alleviated in principle.

However, the flash memory cells may increase the costs since it is necessary that a process for forming CMOS circuits is mixed with a process for forming flash memory cells. The anti-fuse elements may be produced at low costs during a normal CMOS process. However, since they cannot be rewritten, they may not be used in a development stage in which trial and error is required.

BRIEF DESCRIPTION OF THE DRAWINGS

FIG. 15 is an explanatory diagram illustrating a case where the memory cell of the fourth embodiment has a circuit configuration equivalent to an NAND latch.

DETAILED DESCRIPTION

Embodiments of the present invention will be described below with reference to the accompanying drawings.

Before embodiments of the present invention are described, how the present invention has been reached will be described.

Figure 1:
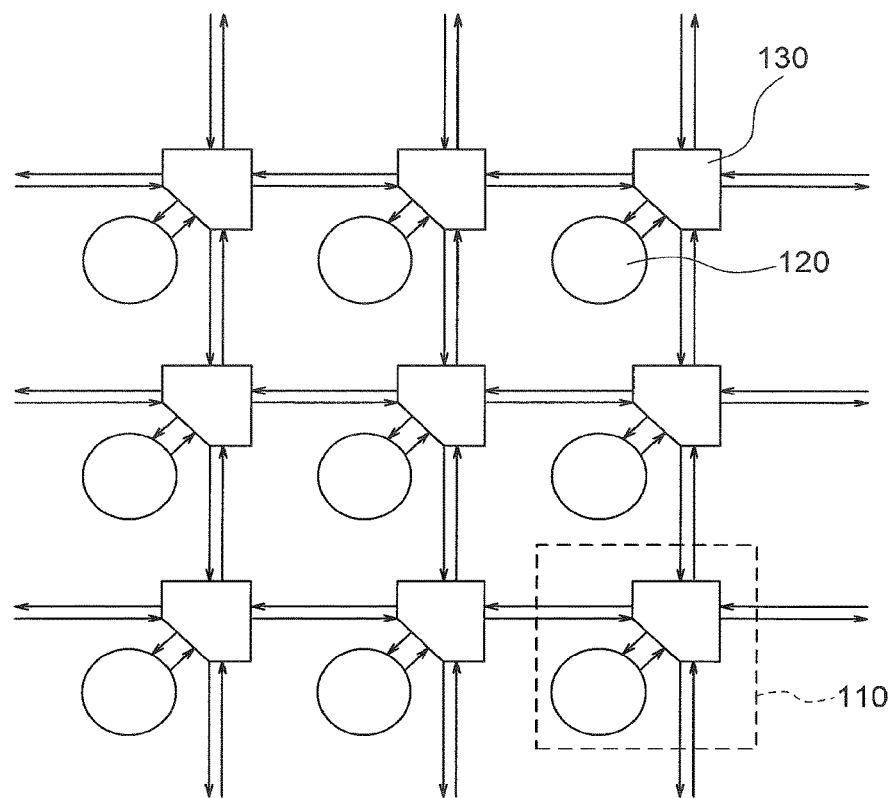
FIG. 1 is a diagram illustrating a common configuration of an FPGA.

FIG. 1 shows a common FPGA configuration. A FPGA 100 generally includes a plurality of basic blocks 110 arranged in an array form. Each basic block 110 is connected to adjacent basic blocks 110 with wiring lines, and includes a logic block 120 and a switch block 130. The logic block 120 performs logical operations basically using a look-up table ("LUT") containing a truth table. Each switch block 130 controls the connection and the disconnection of the wiring lines connecting to adjacent basic blocks 110 so that signals are transmitted to given directions. Each switch block 130 also connects to the logic block 120 included in the relevant basic block 110 including the switch block 130. The logic block 120 and the switch block 130 may control the connection based on data stored in a programmable logic circuit, or a configuration memory.

Figure 2:
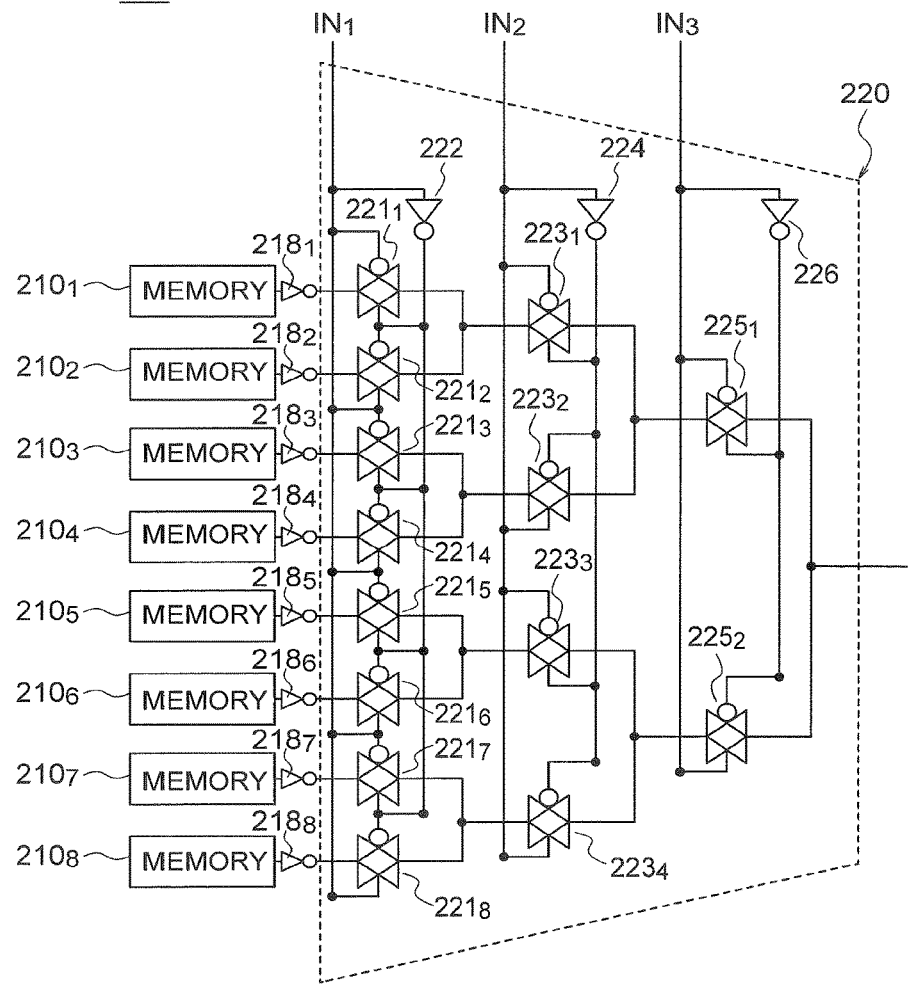
FIG. 2 is a circuit diagram illustrating an example of an LUT circuit.

FIG. 2 shows an example of an LUT circuit 200 included in the logic block 120, which has a three-input-one-output configuration. The LUT circuit 200 includes eight memory cells $210_1$ to $210_8$, eight CMOS inverters $218_1$ to $218_8$, of which a CMOS inverter $218_i$ (i=1, . . . , 8) receives an output from the corresponding memory cell $210_i$, and an MUX circuit 220 configured to select one of the memory cells $210_1$ to $210_8$ in accordance with input signals $IN_1$, $IN_2$, and $IN_3$, and output a value held in the selected memory cell. The output terminal of the memory cell $210_i$ (i=1, . . . , 8) is connected to an input terminal of the corresponding CMOS inverter circuit $218_i$, specifically a gate terminal of a transistor included in the CMOS inverter circuit $218_i$. An output terminal of the CMOS inverter circuit $218_i$ (i=1, . . . , 8) is connected to an input terminal of the MUX circuit 220.

The MUX circuit 220 includes eight transfer gates $221_1$ to $221_8$ and an inverter 222 disposed in a first stage, four transfer gates $223_1$ to $223_4$ and an inverter 224 disposed in a second stage, two transfer gates $225_1$ and $225_2$ and an inverter 226 disposed in a third stage. The inverter 222 receives the input signal $IN_1$ at its input terminal, the inverter 224 receives the input signal $IN_2$ at its input terminal, and the inverter 226 receives the input signal $IN_3$ at its input terminal.

An input terminal of the transfer gate $221_i$ (i=1, . . . 8) is connected to the CMOS inverter circuit $218_i$. If i is an odd number, a gate of a p-channel transistor of the transfer gate $221_i$ receives the input signal $IN_1$, and a gate of an n-channel transistor of the transfer gate $221_i$ receives an output signal from the inverter 222. If i is an even number, a gate of an n-channel transistor of the transfer gate $221_i$ receives the input signal $IN_1$, and a gate of a p-channel transistor of the transfer gate $221_i$ receives the output signal from the inverter 222.

An input terminal of the transfer gate $223_i$ (i=1, . . . , 4) is connected to an output terminal of the transfer gate $221_{2i-1}$ and an output terminal of the transfer gate $221_{2i}$. If i is an odd number, a gate of a p-channel transistor of the transfer gate $223_i$ receives the input signal $IN_2$, and a gate of an n-channel transistor of the transfer gate $223_i$ receives an output signal from the inverter 224. If i is an even number, a gate of an n-channel transistor of the transfer gate $223_i$ receives the input signal $IN_2$, and a gate of a p-channel transistor of the transfer gate $223_i$ receives the output signal from the inverter 224.

An input terminal of the transfer gate $225_i$ (i=1, 2) is connected to an output terminal of the transfer gate $223_{2i-1}$ and an output terminal of the transfer gate $223_{2i}$. If i is an odd number, a gate of a p-channel transistor of the transfer gate $225_i$ receives the input signal $IN_3$, and a gate of an n-channel transistor of the transfer gate $225_i$ receives an output signal from the inverter 226. If i is an even number, a gate of an n-channel transistor of the transfer gate $225_i$ receives the input signal $IN_3$, and a gate of a p-channel transistor of the transfer gate $225_i$ receives the output signal of the inverter 226. Output terminals of transfer gates $225_1$ and $225_2$ are connected to an output terminal of the MUX circuit 220.

Figure 3:
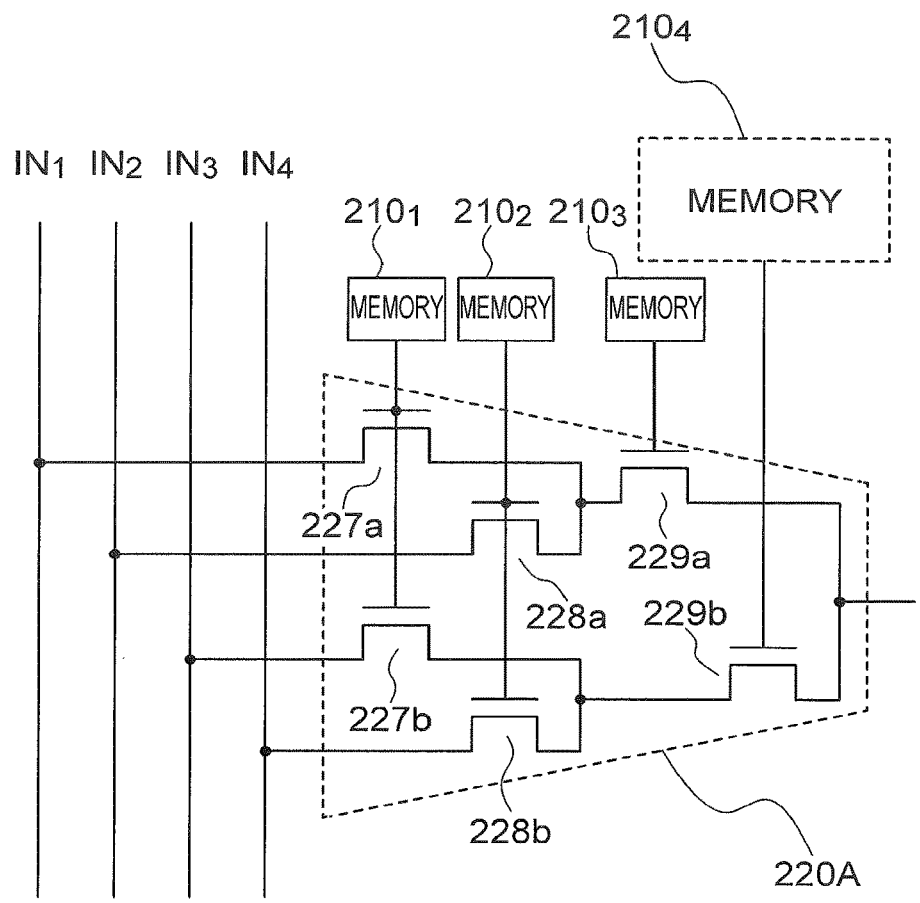
FIG. 3 is a circuit diagram illustrating an example of an MUX circuit.

Although FIG. 2 illustrates a case where the MUX circuit 220 includes the transfer gates, the MUX circuit 220 may include other elements such as MOS transistors. For example, a MUX circuit 220A shown in FIG. 3 includes MOS transistors 227a, 227b, 228a, 228b, 229a, and 229b.

The MOS transistor 227a has a source terminal and a drain terminal, one of which receives an input signal $IN_1$, and a gate terminal that is connected to an output terminal of a memory $210_1$. The MOS transistor 227b has a source terminal and a drain terminal, one of which receives an input signal $IN_3$, and a gate terminal that is connected to the output terminal of the memory $210_1$.

The MOS transistor 228a has a source terminal and a drain terminal, one of which receives an input signal $IN_2$, and a gate terminal that is connected to an output terminal of a memory $210_2$. The MOS transistor 228b has a source terminal and a drain terminal, one of which receives an input signal $IN_4$, and a gate terminal that is connected to the output terminal of the memory $210_2$.

The MOS transistor 229a has a source terminal and a drain terminal, one of which is connected to the other of the source terminal and the drain terminal of the MOS transistor 227a and the other of the source terminal and the drain terminal of the MOS transistor 228a, and a gate terminal that is connected to an output terminal of the memory $210_3$. The MOS transistor 229b has a source terminal and a drain terminal, one of which is connected to the other of the source terminal and the drain terminal of the MOS transistor 227b and the other of the source terminal and the drain terminal of the MOS transistor 228b, and a gate terminal that is connected to an output terminal of a memory $210_4$. The other of the source terminal and the drain terminal of the MOS transistor 229a and the other of the source terminal and the drain terminal of the MOS transistor 229b are connected to an output terminal of the MUX circuit 220A.

Figure 4:
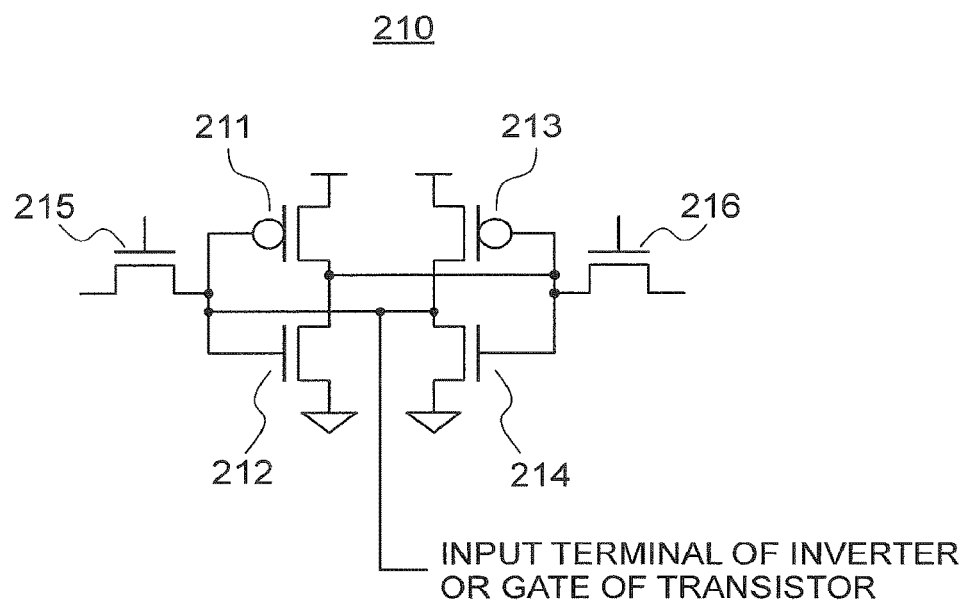
FIG. 4 is a diagram illustrating a memory cell included in the circuit shown in FIG. 2 or FIG. 3.

FIG. 4 shows minimum elements of a SRAM cell circuit generally used as a memory cell $210_i$ (i=1, . . . , 8). The memory cell $210_i$ (i=1, . . . , 8) includes a first inverter including a p-channel transistor 211 and an n-channel transistor 212, a second inverter including a p-channel transistor 213 and an n-channel transistor 214, and n-channel transistors 215 and 216. An input terminal of the first inverter is connected to an output terminal of the second inverter, and an output terminal of the first inverter is connected to an input terminal of the second inverter. In other words, the first inverter and the second inverter are cross-coupled. The transistor 215 has a source terminal and a drain terminal, one of which is connected to an input terminal of the first inverter, and the transistor 216 has a source terminal and a drain terminal, one of which is connected to an input terminal of the second inverter. An output terminal of the memory cell $210_i$ (i=1, . . . , 8) is connected to the input terminal of the CMOS inverter $218_i$ or the gate of the transistor 227a, 227b, 228a, 228b, 229a, or 229b included in the MUX circuit 220A.

SRAM cells are at risk of being subjected to soft errors caused by collision of high-energy particles or noise. If soft errors occur in a configuration memory of an FPGA, the FPGA may malfunction since the circuit information of the FPGA may be rewritten.

The inventors of the present invention have studied hard to develop a configuration memory circuit, which may be rewritten in a development stage, and in which no soft error may be caused during mass production. Embodiments of such a configuration memory will be described below.

A configuration memory circuit according to an embodiment includes: a first wiring line and a second wiring line; a first transistor having a first-conductive-type and including a drain terminal that is connected to the second wiring line, and a gate terminal that is connected to the first wiring line; a second transistor having a second-conductive-type and including a source terminal and a drain terminal, one of which is connected to the drain terminal of the first transistor, and a gate terminal that is connected to a third wiring line; a third transistor having the second-conductive-type and including a source terminal and a drain terminal, one of which is connected to the other of the source terminal and the drain terminal of the second transistor, and a gate terminal that is connected to the gate terminal of the first transistor and the first wiring line; a fourth transistor having the first-conductive-type and including a drain terminal that is connected to the first wiring line, and a gate terminal that is connected to the second wiring line; a fifth transistor having the second-conductive-type and including a source terminal and a drain terminal, one of which is connected to the drain terminal of the fourth transistor, and a gate terminal that is connected to the third wiring line; a sixth transistor having the second-conductive-type and including a source terminal and a drain terminal, one of which is connected to the other of the source terminal and the drain terminal of the fifth transistor, and a gate terminal that is connected to the gate terminal of the fourth transistor and the second wiring line; a seventh transistor having the second-conductive-type and including a source terminal and a drain terminal, one of which is connected to the gate terminal of the first transistor, the gate terminal of the third transistor, and the first wiring line, and the other of which is connected to a fourth wiring line, and a gate terminal that is connected to a fifth wiring line; and an eighth transistor having the second-conductive-type and including a source terminal and a drain terminal, one of which is connected to the gate terminal of the fourth transistor, the gate terminal of the sixth transistor, and the second wiring line, and the other of which is connected to a sixth wiring line, and a gate terminal that is connected to the fifth wiring line.

First Embodiment

Figure 5:
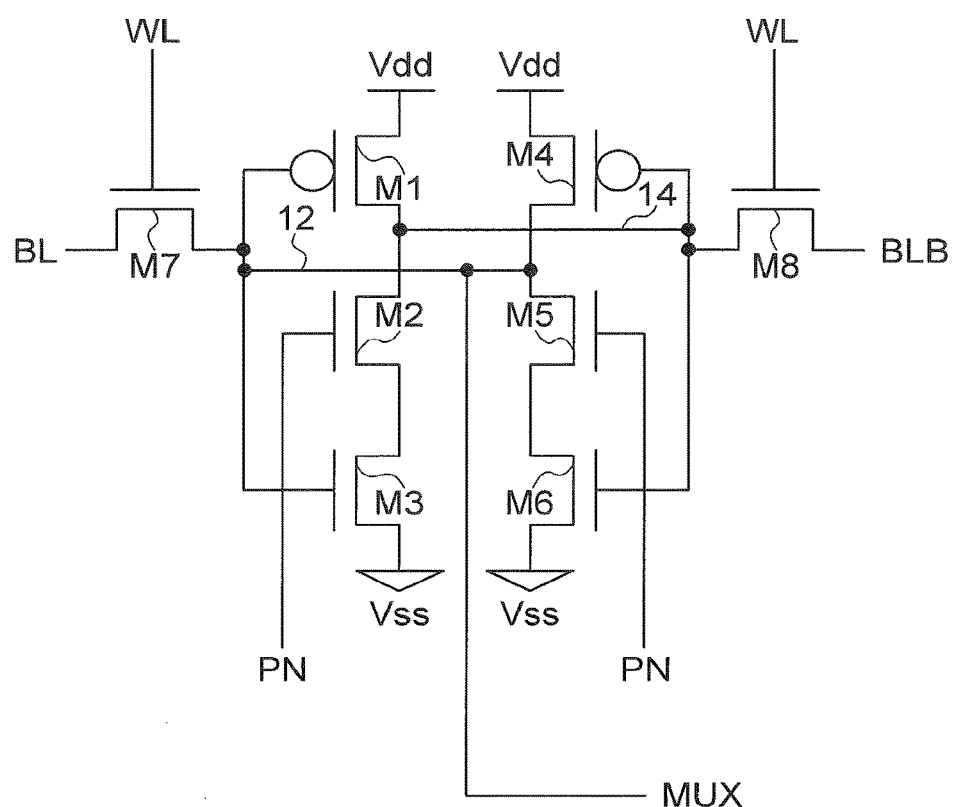
FIG. 5 is a circuit diagram illustrating a memory cell included in a memory circuit according to a first embodiment.

A configuration memory circuit (hereinafter also referred to as "memory circuit") according to a first embodiment will be described with reference to FIGS. 5 to 9. The memory circuit according to the first embodiment includes at least one memory cell, which is shown in FIG. 5. The memory cell 10 includes a p-channel MOS transistor M1, an n-channel MOS transistor M2, an n-channel MOS transistor M3, a p-channel MOS transistor M4, an n-channel MOS transistor M5, an n-channel MOS transistor M6, an n-channel MOS transistor M7, and an n-channel MOS transistor M8. Each of the p-channel MOS transistors and the n-channel MOS transistor may be simply referred to as "transistor." The transistor M1, the transistor M2, and the transistor M3 are connected in series, and the transistor M4, the transistor M5, and the transistor M6 are connected in series. A source terminal of the transistor M1 and a source terminal of the transistor M4 are connected to a high-voltage-side power supply Vdd, and a source terminal of the transistor M3 and a source terminal of the transistor M6 are connected to a low-voltage-side power supply Vss.

One of a source terminal and a drain terminal of the transistor M7 is connected to a bit line (fourth wiring line) BL, the other is connected to a gate terminal of the p-channel MOS transistor M1 and a gate terminal of the n-channel MOS transistor M3, and a gate terminal of the transistor M7 is connected to a word line (fifth wiring line) WL. One of a source terminal and a drain terminal of the transistor M8 is connected to an inverted bit line (sixth wiring line) BLB, the other is connected to a gate terminal of the p-channel MOS transistor M4 and a gate terminal of the n-channel MOS transistor M6, and a gate terminal of the transistor M8 is connected to the word line WL. Signals having inverted values each other are provided to the bit line BL and the inverted bit line BLB when a value is written to the memory cell.

The gate terminal of the transistor M1, the gate terminal of the transistor M3, the other of the source terminal and the drain terminal of the transistor M7, and a connection terminal for connecting the transistor M4 and the transistor M5 are connected by a connection line (first wiring line) 12. The gate terminal of the transistor M4, the gate terminal of the transistor M6, the other of the source terminal and the drain terminal of the transistor M8, and a connection terminal for connecting the transistor M1 and the transistor M2 are connected to a connection line (second wiring line) 14.

A gate terminal of the transistor M2 and a gate terminal of the transistor M5 are each connected to a memory value fixing write line (third wiring line) PN.

One of the connection line 12 and the connection line 14 of the memory cell 10 is connected to a multiplexer (MUX) circuit to provide a memory value used in an LUT circuit of a logic block or a switch block in an FPGA (FIG. 5).

Although the transistor M7 and the transistor M8 are n-channel MOS transistors in this embodiment, a configuration in which they are p-channel MOS transistors may also be possible.

A configuration in which, unlike the configuration of this embodiment, the gate terminal of the transistor M1, the gate terminal of the transistor M3, the other of the source terminal and the drain terminal of the transistor M7, and the connection terminal for connecting the transistor M5 and the transistor M6 are connected, and the gate terminal of the transistor M4, the gate terminal of the transistor M6, the other of the source terminal and the drain terminal of the transistor M8, and the connection terminal for connecting the transistor M2 and the transistor M3 are connected, may also be possible.

Figure 6:
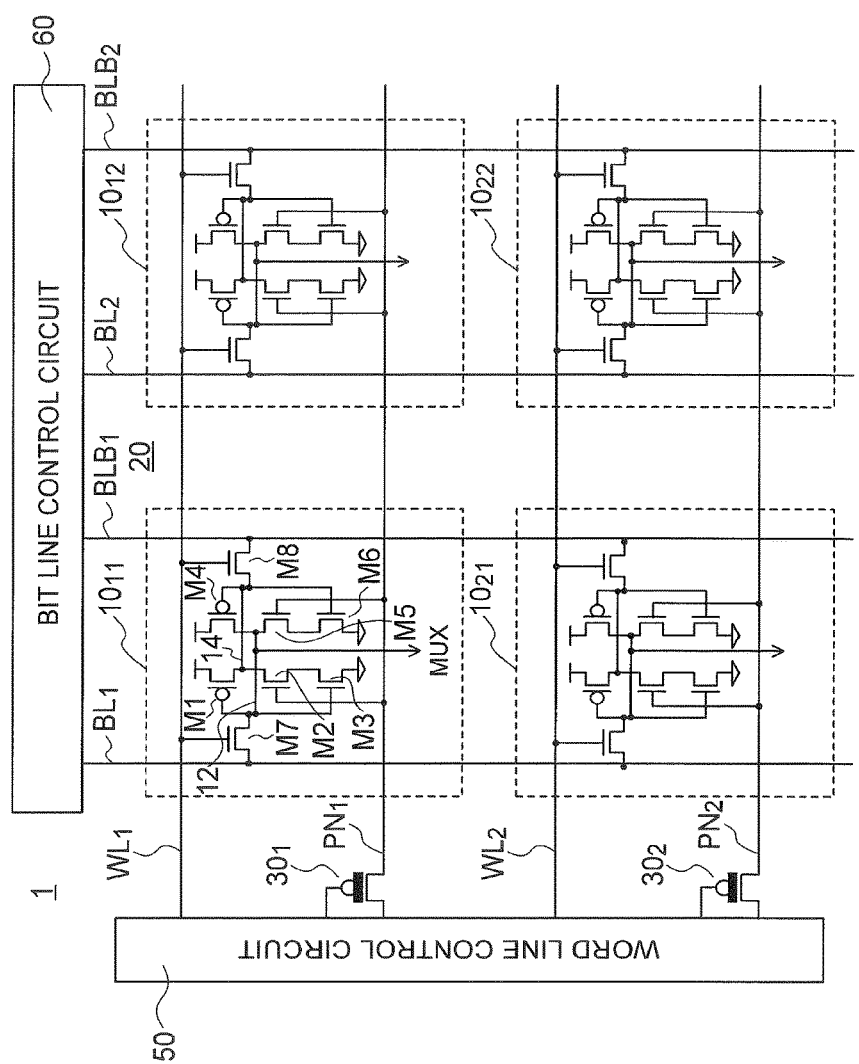
FIG. 6 is a circuit diagram illustrating the memory circuit according to the first embodiment.

FIG. 6 shows a memory circuit according to the first embodiment, which includes a memory cell array 20, word lines $WL_1$ and $WL_2$, bit lines $BL_1$ and $BL_2$, inverted bit lines $BLB_1$ and $BLB_2$, memory value fixing write lines ("write lines") $PN_1$ and $PN_2$, high-voltage p-channel MOS transistors $30_1$ and $30_2$, a word line control circuit 50, and a bit line control circuit 60.

The memory cell array 20 includes memory cells $10_{11}$, $10_{12}$, $10_{21}$, and $10_{22}$ that are arranged in two rows and two columns. Each memory cell $10_{ij}$ (i, j=1, 2) has the same configuration as the memory cell 10 shown in FIG. 5. Each memory cell $10_{ij}$ (i, j=1, 2) thus includes the transistors M1 to M8, which are connected in the manner shown in FIG. 5.

In each of the memory cells $10_{11}$ and $10_{12}$, the gate terminals of the transistors M7 and M8 are connected to the word line $WL_1$, and the gate terminals of the transistors M2 and M5 are connected to the write line $PN_1$. In each of the memory cells $10_{21}$ and $10_{22}$, the gate terminals of the transistors M7 and M8 are connected to the word line $WL_2$, and the gate terminals of the transistors M2 and M5 are connected to the write line $PN_2$.

In each of the memory cells $10_{11}$ and $10_{21}$, one of the source terminal and the drain terminal of the transistor M7 is connected to the bit line $BL_1$, and one of the source terminal and the drain terminal of the transistor M8 is connected to the inverted bit line $BLB_1$. In each of the memory cells $10_{12}$ and $10_{22}$, one of the source terminal and the drain terminal of the transistor M7 is connected to the bit line $BL_2$, and one of the source terminal and the drain terminal of the transistor M8 is connected to the inverted bit line $BLB_2$.

The thickness of a gate insulating film in each of the high-voltage p-channel MOS transistors ("transistor") $30_1$ and $30_2$ is greater than the thickness of gate insulating films in the transistors included in the memory cells. One of a source terminal and a drain terminal of the transistor $30_1$ is connected to the write line $PN_1$, and the other is connected to the word line control circuit 50. One of a source terminal and a drain terminal of the transistor $30_2$ is connected to the write line $PN_2$, and the other is connected to the word line control circuit 50.

The bit lines $BL_1$ and $BL_2$ and the inverted bit lines $BLB_1$ and $BLB_2$ are connected to the bit line control circuit 60.

One of the connection line 12 and the connection line 14 of the memory cell $10_{ij}$ (i, j=1, 2) is connected to a multiplexer (MUX) circuit to provide a memory value used in the LUT circuit of the logic block and the switch block of the FPGA (FIG. 6).

If the memory circuit 1 according to the first embodiment is used as a configuration memory of an FPGA, the number of cells arranged along a word line is preferably greater than the number of cells arranged along a bit line. The reason for this is that data can be simultaneously written to memory cells connected to a single word line but cannot be simultaneously written to memory cells connected to a single bit line. This means that the number of memory cells to which data can be written at a time may be increased and the time required for a write operation may be shortened if the number of memory cells connected to a single word line is greater than the number of memory cells connected to a single bit line.

(Operation in which an FPGA is Rewritable)

Figure 7:
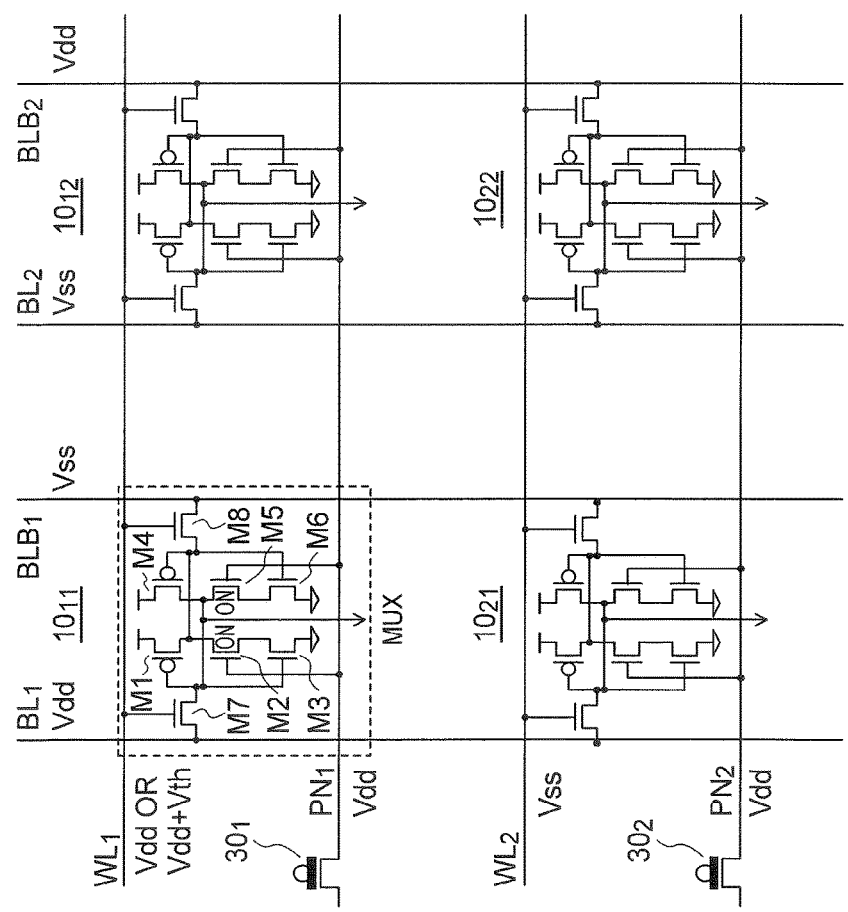
FIG. 7 is an explanatory diagram of an operation in which an FPGA included in a memory circuit according to the first embodiment is used in a rewritable manner.

An operation of the memory circuit according to the first embodiment will be described below with reference to FIG. 7. FIG. 7 illustrates an operation in which an FPGA is used in a rewritable manner. In FIG. 7, the word line control circuit 50 and the bit line control circuit 60 are omitted.

An example of an operation in which a value is written to the memory cells $10_{11}$ and $10_{12}$ in a first row will be described with reference to FIG. 7. First, a high-voltage-side power supply voltage Vdd is supplied from the word line control circuit 50 to the write lines $PN_1$ and $PN_2$ via the transistors $30_1$ and $30_2$ to turn on the transistors M2 and M5 of the memory cells $10_{11}$ to $10_{22}$. As a result, the memory cells $10_{11}$ to $10_{22}$ each including the transistors M1, M3, M4, M6, M7, and M8 form a circuit configuration that is equivalent to a circuit configuration of common SRAM cells, and may operate in the same manner as the common SRAM cells. Specifically, the high-voltage power supply voltage Vdd or a voltage Vdd+Vth that is obtained by boosting a threshold voltage Vth of the transistors M7 and M8 is supplied to a selected word line, for example the word line $WL_1$ of the selected row, and the high-voltage power supply voltage Vdd or a low-voltage power supply voltage Vss is supplied to the bit lines $BL_1$ and $BL_2$ and the inverted bit lines $BLB_1$ and $BLB_2$ by means of the bit line control circuit 60 to write a value to the memory cells $10_{11}$ and $10_{12}$. The low-voltage power supply voltage Vss is supplied to the word line $WL_2$ that is not in the selected row. In the example of FIG. 7, the bit line control circuit 60 supplies the high-voltage power supply voltage Vdd to the bit line $BL_1$ and the low-voltage power supply voltage Vss to the inverted bit line $BLB_1$ to write data "1" to the memory cell $10_{11}$, and supplies the low-voltage power supply voltage Vss to the bit line $BL_2$ and the high-voltage power supply voltage Vdd to the inverted bit line $BLB_2$ to write data "0" to the memory cell $10_{12}$. Data with a meaning may be written to only the memory cell $10_{11}$, and no meaningful data may be written to the memory cell $10_{12}$. In this case, the bit line $BL_1$ and the inverted bit line $BLB_1$ of the selected row are supplied with the high-voltage power supply voltage Vdd or the low-voltage power supply voltage Vss by means of the bit line control circuit 60, and both the bit line $BL_1$ and the inverted bit line $BLB_1$ of the non-selected row are supplied with a high impedance or the low-voltage power supply voltage Vss or the high-voltage power supply voltage Vdd.

(Value Fixing Write Operation)

Figure 8:
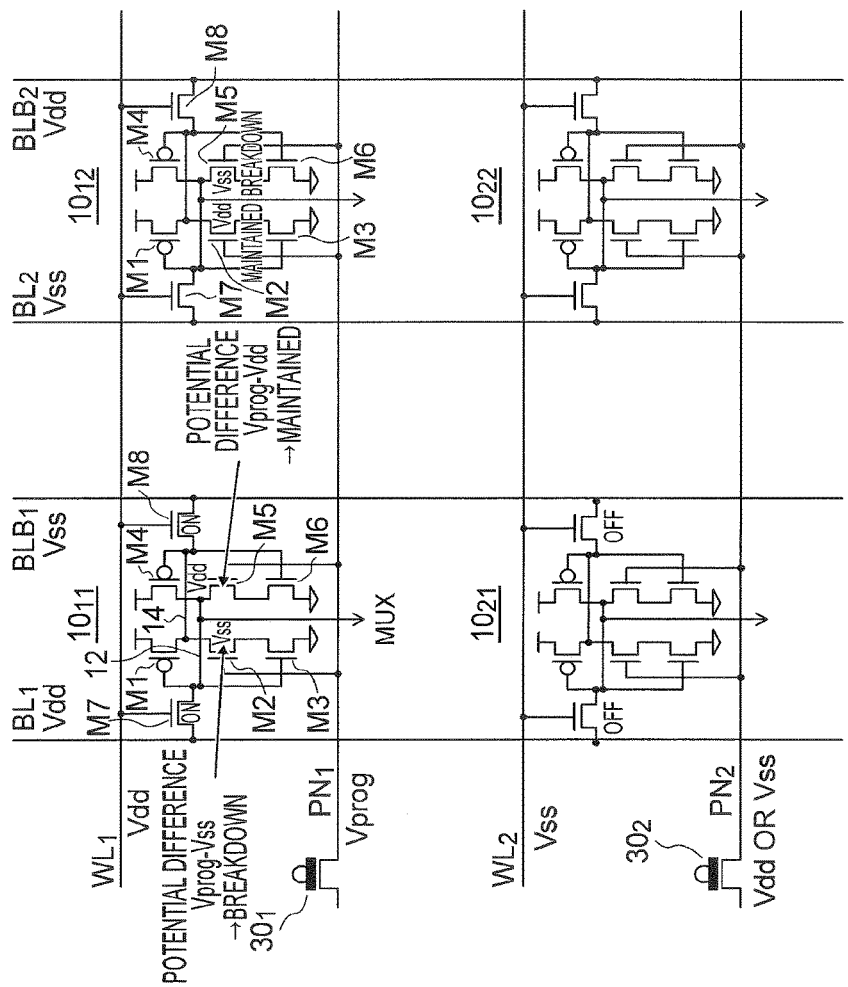
FIG. 8 is an explanatory diagram of a value fixing write operation performed in the memory circuit according to the first embodiment.

FIG. 8 shows a process of fixing values of memory cells so that no soft error occurs. An example in which the values stored in the memory cell $10_{11}$ and the memory cell $10_{12}$ disposed on the first row are fixed to data "0" (Vss) and data "1" (Vdd) will be described.

The word line control circuit 50 supplies the high-voltage power supply voltage Vdd or the voltage Vdd+Vth to the word line $WL_1$ of the selected row to turn on the transistors M7 and M8 of the memory cells $10_{11}$ and $10_{12}$ connected to the word line $WL_1$, and the bit line control circuit 60 supplies the high-voltage power supply voltage Vdd to the bit line $BL_1$, the low-voltage power supply voltage Vss to the inverted bit line $BLB_1$, the low-voltage power supply voltage Vss to the bit line $BL_2$, and the high-voltage power supply voltage Vdd to the inverted bit line $BLB_2$. The word line control circuit 50 also supplies the low-voltage power supply voltage Vss to the non-selected word line $WL_2$ to turn off the transistors M7 and M8 of the memory cells $10_{21}$ and $10_{22}$.

After supplying the required voltages to the word lines $WL_1$ and $WL_2$, the bit lines $BL_1$ and $BL_2$, and the inverted bit lines $BLB_1$ and $BLB_2$, the word line control circuit 50 supplies a write voltage Vprog to the write line $PN_1$. The write voltage Vprog is higher than the high-voltage-side power supply voltage Vdd, and may break the gate insulating films of the transistors M2 and M5. The voltage Vprog is applied to the gate terminal of the transistor M2 included in the memory cell $10_{11}$, and the low-voltage-side power supply voltage Vss is applied to one of the source terminal and the drain terminal. The write voltage Vprog is also applied to the gate terminal of the transistor M5 included in the memory cell $10_{11}$, and the high-voltage-side power supply voltage Vdd is directly applied to one of the source terminal and the drain terminal connected to the transistor M4. Since the transistor M5 is turned on by the write voltage Vprog to form a channel in the transistor M5, a voltage that is close to the high-voltage power supply voltage Vdd is applied to the other of the source terminal and the drain terminal connected to the transistor M6. As a result, a voltage Vprog−Vss is applied to the gate insulating film of the transistor M2, and a voltage Vprog−Vdd is applied to the gate insulating film of the transistor M5. Since the potential difference Vprog−Vss is greater than the potential difference Vprog−Vdd, when the gate insulating film of the transistor M2 is broken, the gate insulating film of the transistor M5 is not broken, and kept in the insulating state.

Similarly, the voltage Vprog−Vss is applied to the gate insulating film of the transistor M5 included in the memory cell $10_{12}$, and the voltage Vprog−Vdd is applied to the gate insulating film included in the transistor M2. When the gate insulating film of the transistor M5, to which the greater potential difference is applied, is broken, the gate insulating film of the transistor M2 is not broken and kept in the insulating state.

The state where then gate insulating film of a transistor is broken means that the resistance value between the gate and at least one of the source and the drain is dramatically decreased from an insulating state. The change in current value caused by the decrease in the resistance value is greater than the variations in the gate leakage current due to manufacturing, which may be about 10%, for example. And in the case described above, a resistance value between the gate terminal and the one of the source terminal and the drain terminal of the transistor M2 differ by 10% or more from a resistance value between the gate terminal and the one of the source terminal and the drain terminal of the transistor M5. The resistance value between the gate and the at least one of the source and the drain after the gate insulating film is broken is about several tens kΩ to several hundreds Ω.

At this time, the word line control circuit 50 applies the high-voltage power supply voltage Vdd or the low-voltage power supply voltage Vss to the memory value fixing write line $PN_2$. This makes it possible to prevent the non-selected memory cells from being subjected to the influence of the memory value fixing write operation.

(Read Operation)

Figure 9:
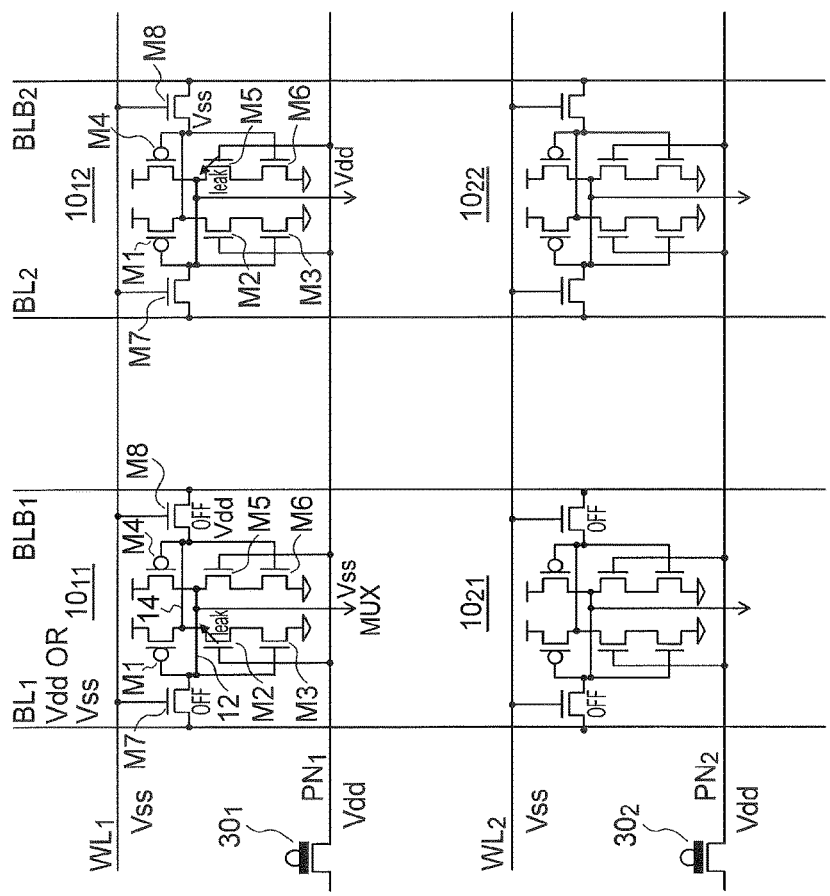
FIG. 9 is an explanatory diagram of a read operation performed after the value fixing write operation in the memory circuit according to the first embodiment.

A read operation that is performed after the memory value fixing write operation is performed on the memory cells will be described with reference to FIG. 9. The example in which the memory value fixing write operation is performed on the memory cells $10_{11}$ and $10_{12}$ as shown in FIG. 8 will be described.

The gate insulating film of the transistor M2 included in the memory cell $10_{11}$ is broken, and the gate insulating film of the transistor M5 included in the memory cell $10_{12}$ is broken. In a read operation that is performed after the memory values are fixed in the write operation, the word line control circuit 50 applies the voltage Vss to the word lines $WL_1$ and $WL_2$ to turn off the transistors M7 and M8 of the memory cells $10_{11}$ to $10_{22}$. The word line control circuit 50 then applies the voltage Vdd to the memory value fixing write lines $PN_1$ and $PN_2$. Since the gate insulating film of the transistor M2 included in the memory cell $10_{11}$ is broken, the voltage Vdd is conveyed through the gate insulating film of the transistor M2 and applied to one of the source terminal and the drain terminal of the transistor M1 and the connection line 14 connecting to the gate terminals of the transistors M4 and M6. As a result, the voltage Vdd is forcibly applied to the connection line 14, which is cross-coupled to the connection line 12. Since the voltage Vss is applied to the connection line 12, the output of the memory cell $10_{11}$ to MUX is fixed to the voltage Vss. In the memory circuit according to the first embodiment, the output of each of the memory cells is the potential of the connection line 12.

Also in the memory cell $10_{12}$, the voltage Vdd is applied to one of the source terminal and the drain terminal of the transistor M4 and the connection line 12 connecting to the gate terminals of the transistors M1 and M3 through the gate insulating film of the transistor M5, and the output of the memory cell $10_{12}$ to MUX is fixed to the voltage Vdd. In this state, the values of the memory cells included in the memory circuit according to this embodiment are determined by the voltage Vdd supplied from the memory value fixing write lines $PN_1$, $PN_2$, and therefore not flipped by high-energy particles or noise. Therefore, a configuration memory circuit for a FPGA that is not subjected to soft errors may be achieved.

If the voltage applied to the connection line 14 or the connection line 12 is Vss in the initial state of each memory cell, the value of the memory cell need to be changed by supplying the power supply voltage Vdd to the memory cell via the transistor M2 or the transistor M5 from the memory value fixing write lines $PN_1$ and $PN_2$ by means of the word line control circuit 50. In such a case, supplying the power supply voltage Vdd to the memory cell after supplying the power supply voltage Vdd to the memory value fixing write lines $PN_1$ and $PN_2$ helps fix the value. The fixing of the value may also be helped by setting the voltages supplied from the memory value fixing write lines $PN_1$ and $PN_2$ to be higher than the power supply voltage Vdd. The fixing of the value may also be helped by setting the channel width of the transistor M3 and the transistor M6 to be less than that of the other transistors M1, M2, M4, and M5, or to be a minimum value permitted by the design rule. The fixing of the value may also be helped by a combination of the above methods.

As described above, the voltage applied to the memory value fixing write lines $PN_1$ and $PN_2$ is the power supply Vdd (if the switching of value needs to be helped, a voltage that is higher than Vdd) or the write voltage Vprog, and there is no case in which the voltage Vss is applied. Therefore, it is preferable that the high breakdown voltage transistors $30_1$ and $30_2$ connected to one end of the memory value fixing write lines $PN_1$ and $PN_2$ be p-channel MOS transistor.

Figure 10A:
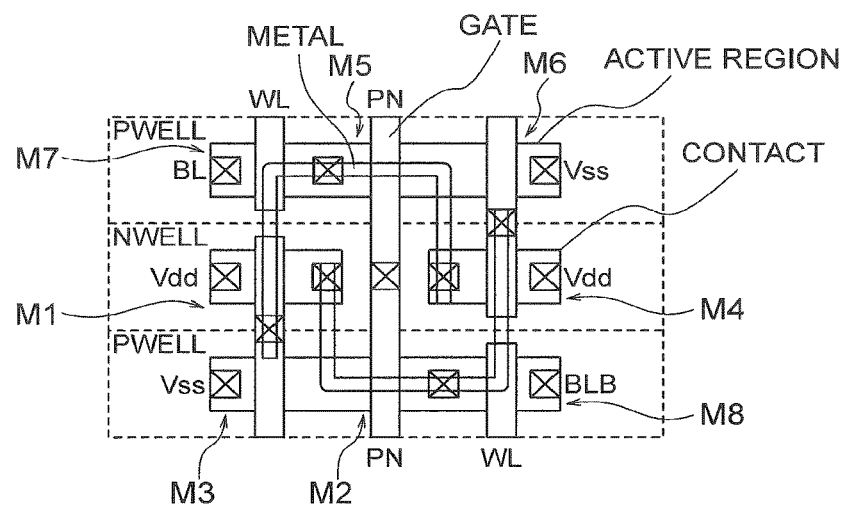
FIGS. 10A and 10B are diagrams illustrating examples of a layout of the memory cells according to the first embodiment.
Figure 10B:
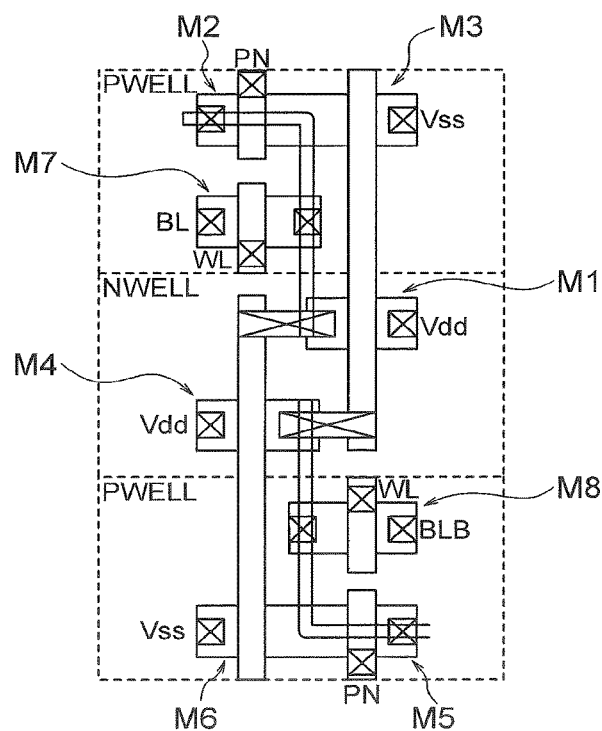

Next, examples of a layout of memory cells included in the memory circuit according to the first embodiment will be described with reference to FIGS. 10A and 10B. FIG. 10A is a layout that may be made by a general CMOS process. FIG. 10B is an expanded version of a layout of highly integrated SRAM cells with contacts of different sizes. In both the layouts, the memory cells are symmetrically arranged relative to a central point. By appropriately reversing or rotating, the memory cells may be arranged in an array.

Figure 11:
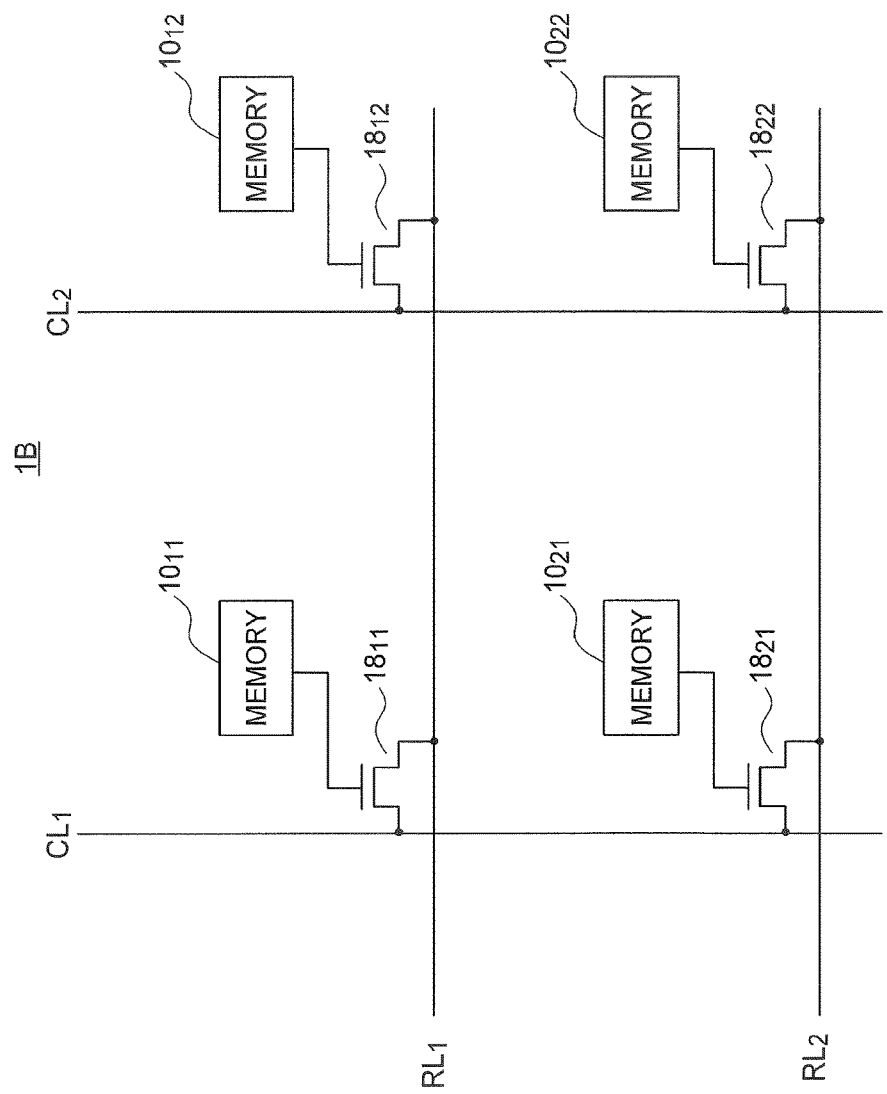
FIG. 11 is a circuit diagram illustrating a memory circuit according to a first modification of the first embodiment.

In the above descriptions, the outputs from the memory cells of this embodiment are intended to connect to an MUX circuit. However, the memory cells of this embodiment are not limited to be connected to multiplexer circuits. For example, as in a memory circuit 1A according to a first modification shown in FIG. 11, the memory cell $10_{ij}$ of this embodiment may be connected to the gate of a switch transistor $18_{ij}$ (i, j=1, 2) among switch transistors $18_{11}$ to $18_{22}$ arranged in intersection regions of wiring lines $RL_1$, $RL_2$, $CL_1$, and $CL_2$ that are arranged in a crossbar form, so that the wiring lines are used as crossbar wiring lines.

Although the potential signal of one of the connection line 12 and the connection line 14 in each memory cell is outputted to the MUX circuit in this embodiment, both potential signals may be outputted to the MUX circuit. If the voltage Vdd is applied to one of the connection line 12 and the connection line 14, the voltage Vss is applied to the other. Therefore, if both the voltage Vdd and the voltage Vss are necessarily used as in the circuit shown in FIG. 3, the circuit area may be reduced by unifying two memory cells into one.

Second Embodiment

Figure 12:
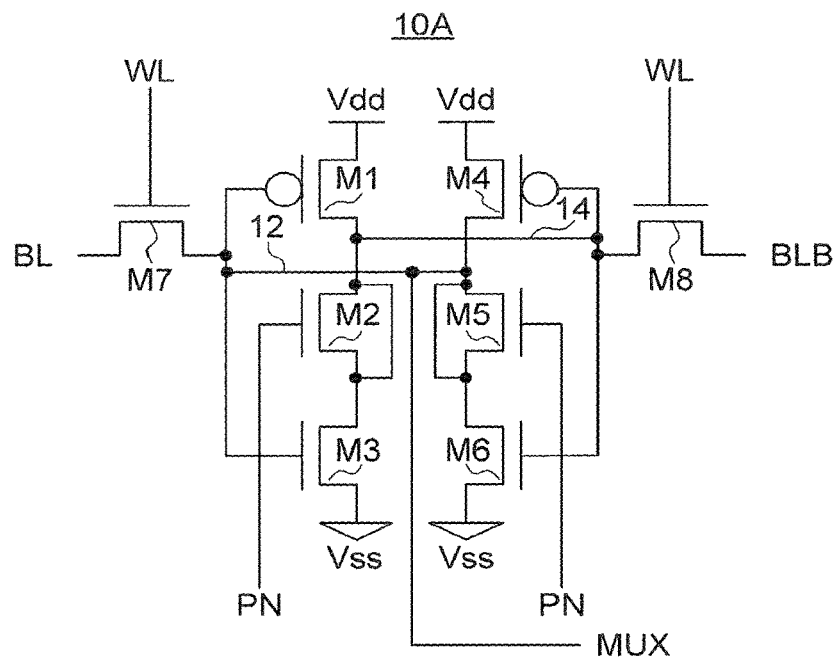
FIG. 12 is a circuit diagram illustrating a memory cell included in a memory circuit according to the second embodiment.

A configuration memory circuit ("memory circuit") according to a second embodiment will be described with reference to FIG. 12. A memory circuit according to the second embodiment is obtained by replacing each of the memory cells $10_{11}$ to $10_{22}$ of the memory circuit 1 according to the first embodiment shown in FIG. 6 with a memory cell 10A shown in FIG. 12. The memory cell 10A according to the second embodiment has a configuration in which the source terminal and the drain terminal of each of the transistors M2 and M5 are connected to each other in the memory cell 10 according to the first embodiment shown in FIG. 5, the gate insulating film of each of the transistors M2 and M5 being intended to be broken for fixing memory values. This configuration slightly increases in area by the contact connecting the source terminal and the drain terminal, but improves writing yield since the memory value may be fixed by breaking only one of the source terminal and the drain terminal. The operation of this circuit is the same as that of the memory circuit according to the first embodiment, and therefore no explanation is provided. A configuration memory circuit for FPGA that does not cause soft errors may also be achieved by using the memory cell 10A according to the second embodiment.

Third Embodiment

Figure 13:
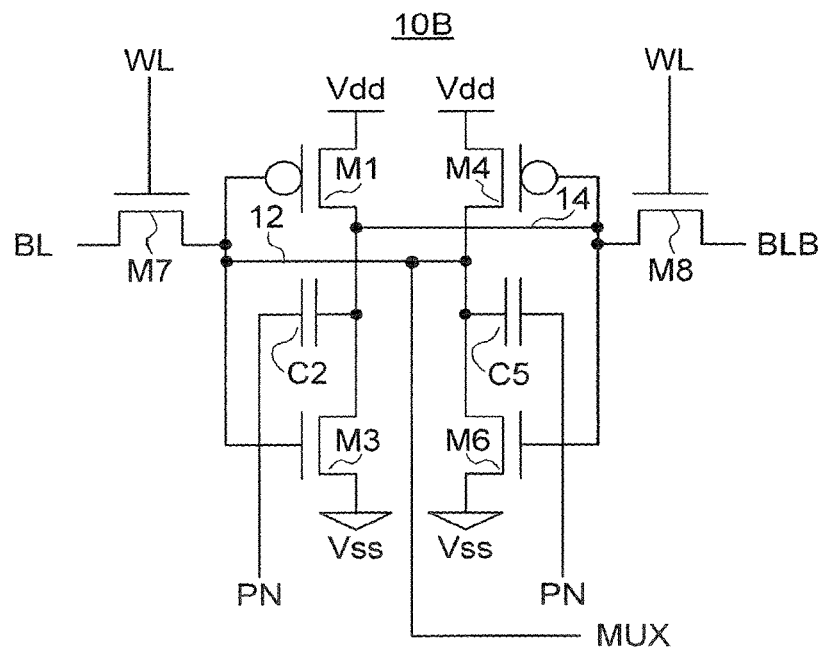
FIG. 13 is a circuit diagram illustrating a memory cell included in a memory circuit according to a third embodiment.

A configuration memory circuit ("memory circuit") according to a third embodiment will be described with reference to FIG. 13. A memory circuit according to the third embodiment is obtained by replacing each of the memory cells $10_{11}$ to $10_{22}$ of the memory circuit 1 according to the first embodiment shown in FIG. 6 with a memory cell 10B shown in FIG. 13. The memory cell 10B according to the third embodiment includes capacitors C2 and C5 instead of the transistors M2 and M5, in each of which the gate insulating film is intended to be broken for fixing the memory value, in the memory cell 10 according to the first embodiment shown in FIG. 5. In order to fix the memory value, either of the capacitors is broken so that a current may flow between the terminals of the capacitor. The operation of this circuit is the same as that of the memory circuit according to the first embodiment, and therefore no explanation is provided. A configuration memory circuit for FPGA that does not cause soft errors may also be achieved by using the memory cell 10B according to the third embodiment.

Fourth Embodiment

Figure 14:
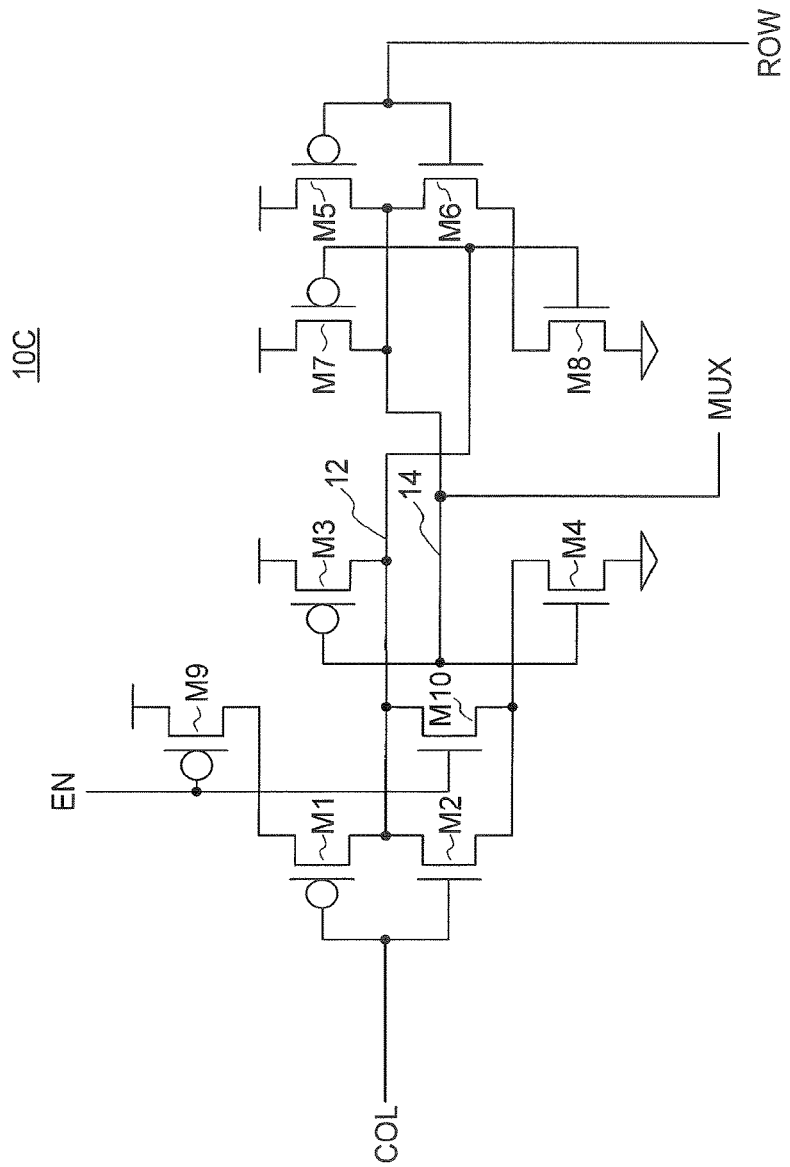
FIG. 14 is circuit diagram illustrating a memory cell included in a memory circuit according to a fourth embodiment.

A configuration memory circuit ("memory circuit") according to a fourth embodiment will be described with reference to FIGS. 14 to 20. The memory circuit according to the fourth embodiment includes at least one memory cell, which is shown in FIG. 14. Unlike the SRAM cell-based memory cells according to the first to third embodiments, the memory cell 10C according to the fourth embodiment is a latch-circuit-based memory cell including NAND gates.

The memory cell 10C according to the fourth embodiment includes p-channel transistors M1, M3, M5, M7, and M9 and n-channel transistors M2, M4, M6, M8, and M10. The p-channel MOS transistors and the n-channel MOS transistor will be simply called "transistors" below.

The circuit configuration including the transistors M1 to M8 is a general NAND latch circuit configuration except that the source terminal of the transistor M1 is connected to the drain terminal of the transistor M9. One input is connected to a column signal line COL and another input is connected to a row signal line ROW.

The transistors M9, M1, and M2 are connected in series. Specifically, the drain terminal of the transistor M9 and the source terminal of the transistor M1 are connected to each other, and the drain terminal of the transistor M1 and the drain terminal of the transistor M2 are connected each other. The gate terminal of the transistor M1 and the gate terminal of the transistor M2 are connected to the column wiring line COL. The source terminal of each of the transistors M3, M5, M7, and M9 is connected to the high-voltage power supply Vdd.

The transistor M2 is connected in parallel to the transistor M10. Specifically, the source terminal of the transistor M2 and the source terminal of the transistor M10 are connected to each other, and the drain terminal of the transistor M2 and the drain terminal of the transistor M10 are connected to each other. The gate terminal of the transistor M10 and the gate terminal of the transistor M9 are connected to an enable signal line EN.

The drain terminal of the transistor M3 is connected to the drain terminal of the transistor M1, the drain terminal of the transistor M2, and the drain terminal of the transistor M10, and the gate terminal of the transistor M3 is connected to the gate terminal of the transistor M4. The drain terminal of the transistor M4 is connected to the source terminal of the transistor M2 and the source terminal of the transistor M10, and the source terminal of the transistor M4 is connected to the low-voltage power supply Vss. Therefore, the transistors M3, M2, and M4 are connected in series, and the transistors M3, M10, and M4 are connected in series.

The transistors M5, M6, and M8 are connected in series. The gate terminal of the transistor M5 and the gate terminal of the transistor M6 are connected to a row wiring line ROW. The source terminal of the transistor M8 is connected to the low-voltage power supply Vss. The gate terminal of the transistor M7 is connected to the gate terminal of the transistor M8, the drain terminal of the transistor M1, the drain terminal of the transistor M2, the drain terminal of the transistor M3, and the drain terminal of the transistor M10. The drain terminal of the transistor M7 is connected to the drain terminal of the transistor M5, the drain terminal of the transistor M6, the gate terminal of the transistor M3, and the gate terminal of the transistor M4. Thus, in the memory cell according to the fourth embodiment, the output line of the NAND gate connecting to the column wiring line COL is the connection line 12, and the output line of the NAND gate connecting to the row wiring line ROW is the connection line 14. The transistor M9 is disposed between the transistor M1 and the high-voltage-side power supply Vdd, the transistor M10 is disposed to be in parallel to the transistor M2, and the gate terminal of the transistor M9 and the gate terminal of the transistor M10 are connected to the enable signal line EN. The memory cell according to the fourth embodiment, which is NAND latch based, may perform a write operation using logic signals. This enables the memory cells to be controlled easily.

One of the connection line 12 and the connection line 14 included in the memory cell 10C is connected to a multiplexer (MUX) circuit to provide a memory value used in a switch block or a LUT circuit of a logic block in an FPGA (FIG. 14).

In the memory cell 10C according to the fourth embodiment shown in FIG. 14, the low-voltage-side power supply voltage Vss is supplied to the enable signal line EN to turn on the transistor M9 and turn off the transistor M10 of the memory cell 10C. This makes the circuit including the transistors M1 to M8 equivalent to a common NAND latch circuit. Therefore, such a circuit may be operated in the same manner as an NAND latch circuit. FIG. 15 shows a relation among the voltages supplied to the column wiring line COL and the row wiring line ROW and the output of the memory cell 10C. In FIG. 15, the output of the memory cell corresponds to the potential of the connection line 12.

Figure 16:
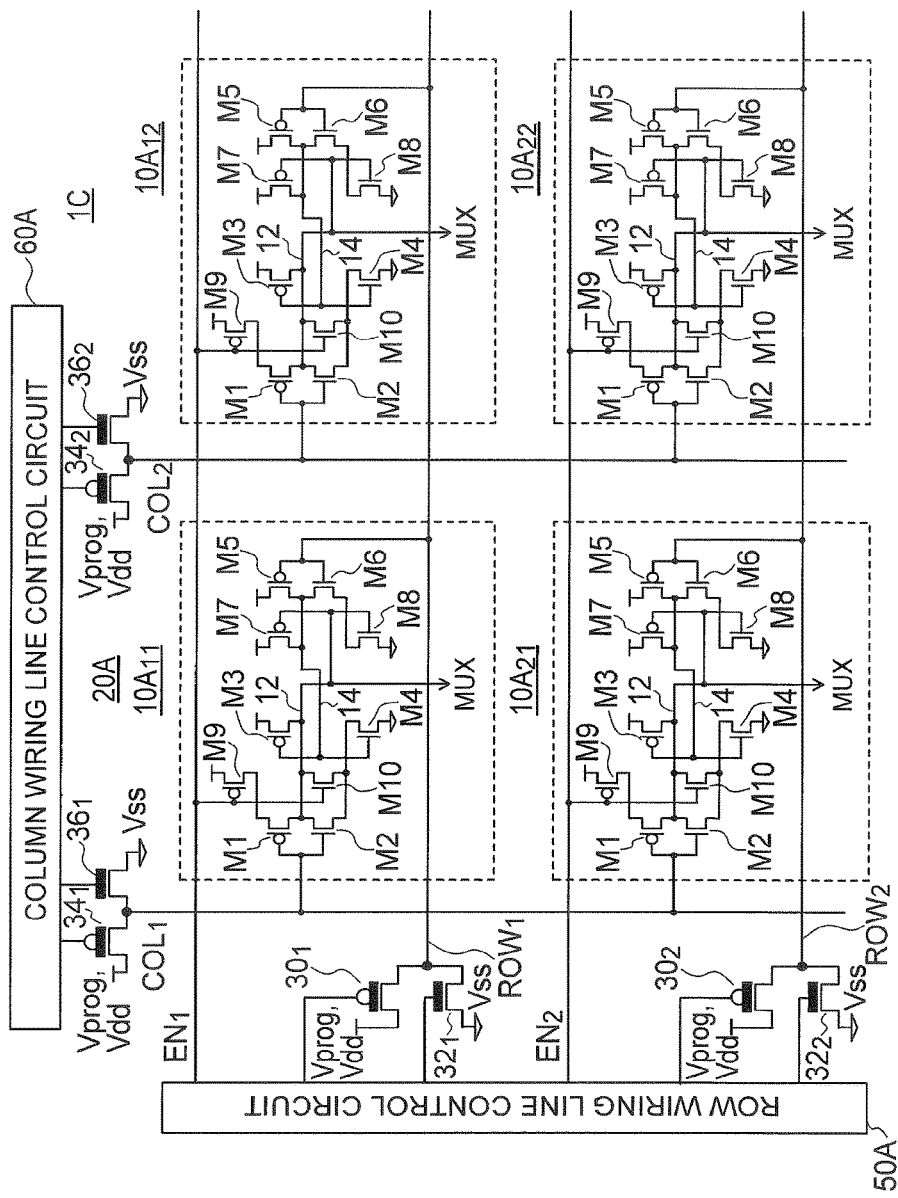
FIG. 16 is a circuit diagram illustrating the memory circuit according to the fourth embodiment.

FIG. 16 shows a memory circuit according to the fourth embodiment. The memory circuit 1C according to the fourth embodiment includes a memory cell array 20A, a row wiring lines $ROW_1$ and $ROW_2$, column wiring lines $COL_1$ and $COL_2$, enable signal lines $EN_1$ and $EN_2$, high-voltage p-channel MOS transistors $30_1$ and $30_2$, high-voltage n-channel MOS transistors $32_1$ and $32_2$, high-voltage p-channel MOS transistors $34_1$ and $34_2$, high-voltage n-channel MOS transistors $36_1$ and $36_2$, a row wiring line control circuit 50A, and a column wiring line control circuit 60A.

The memory cell array 20A includes memory cells $10A_{11}$, $10A_{12}$, $10A_{21}$, and $10A_{22}$ that are arranged in two rows and two columns. Each memory cell $10A_{ij}$ (i, j=1, 2) has the same configuration as the memory cell 10C shown in FIG. 14. Specifically, each memory cell $10A_{ij}$ (i, j=1, 2) includes the transistors M1 to M10, which are connected in the same manner as the transistors shown in FIG. 14.

In each of the memory cells $10A_{11}$ and $10A_{12}$, the gate terminals of the transistors M9 and M10 are connected to the enable signal line $EN_1$, and the gate terminals of the transistors M5 and M6 are connected to the row wiring line $ROW_1$. In each of the memory cells $10A_{21}$ and $10A_{22}$, the gate terminals of the transistors M9 and M10 are connected to the enable signal line $EN_2$, and the gate terminals of the transistors M5 and M6 are connected to the row wiring line $ROW_2$.

In each of the memory cells $10A_{11}$ and $10A_{21}$, the gate terminals of the transistors M1 and M2 are connected to the column wiring line $COL_1$. In each of the memory cells $10A_{12}$ and $10A_{22}$, the gate terminals of the transistors M1 and M2 are connected to the column wiring line $COL_2$.

At least one of the connection line 12 and the connection line 14 in each memory cell $10A_{ij}$ (i, j=1, 2) is connected to the input terminal of the MUX circuit.

The thickness of the gate insulating film in each of the high-voltage p-channel MOS transistors ("transistors") $30_1$, $30_2$, $34_1$, and $34_2$ and the high-voltage n-channel MOS transistors ("transistors") $32_1$, $32_2$, $36_1$, and $36_2$ is thicker than the gate insulating film of each of the transistors included in the memory cells.

In the transistor $30_i$ (i=1, 2), the source terminal receives the write voltage (or memory value fixing write voltage) Vprog or the power supply voltage Vdd, the drain terminal is connected to the row wiring line $ROW_i$, and the gate terminal is connected to the row wiring line control circuit 50A.

In the transistor $32_i$ (i=1, 2), the source terminal is connected to the low-voltage power supply Vss, the drain terminal is connected to the row wiring line $ROW_i$, and the gate terminal is connected to the row wiring line control circuit 50A.

In the transistor $34_i$ (i=1, 2), the source terminal receives the write voltage Vprog or the power supply voltage Vdd, the drain terminal is connected to the column wiring line $COL_i$, and the gate terminal is connected to the column wiring line control circuit 60A.

In the transistor $36_i$ (i=1, 2), the source terminal is connected to the low-voltage power supply Vss, the drain terminal is connected to the column wiring line $COL_i$, and the gate terminal is connected to the column wiring line control circuit 60A.

Thus, in the memory circuit according to the fourth embodiment, the memory cells arranged in the row direction share the row wiring line ROW and the enable signal line EN. The memory cells arranged in the column direction share the column wiring line COL.

(Operation to Rewritably Use FPGA)

Figure 17:
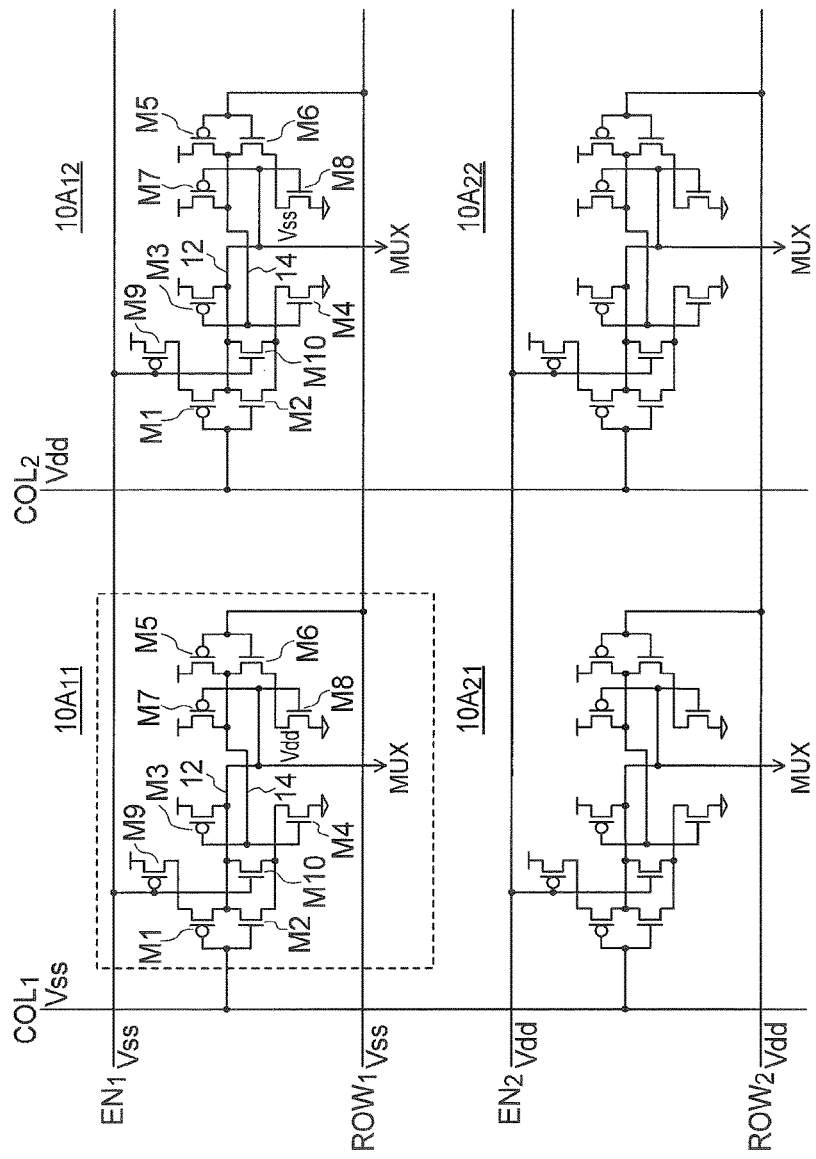
FIG. 17 is an explanatory diagram illustrating a case where the memory circuit is used so that the FPGA may be rewritten in the fourth embodiment.

An operation of the memory circuit according to the fourth embodiment will be described with reference to FIG. 17. FIG. 17 illustrates an operation in which the memory circuit of the FPGA is rewritably used. In the memory circuit according to the fourth embodiment, the output of each memory cell corresponds to the potential of the connection line 12. The output of each memory cell may correspond to the potential of the connection line 14.

In order to write data to the memory cells $10A_{11}$ to $10A_{22}$ arranged in an array form, the enable signal lines $EN_1$ and $EN_2$ are used. Data is written row by row. First, the row wiring line control circuit 50A selects a row (for example a first row) and applies the voltage Vss to the enable signal line $EN_1$ and the row wiring line $ROW_1$. The row wiring line control circuit 50A applies the voltage Vdd to the enable signal line $EN_2$ and the row wiring line $ROW_2$ of the non-selected row. In this state, the column wiring line control circuit 60A applies the voltage Vss or the voltage Vdd to the column wiring lines $COL_1$ and $COL_2$ to set a value of each memory cell in the selected row.

The row wiring line control circuit 50A then applies the voltage Vdd to the row wiring line $ROW_1$ and the enable signal line $EN_1$ of the selected row. The voltage Vdd is first applied to the row wiring line $ROW_1$, and then the enable signal line $EN_1$. As a result, the values of the memory cells $10A_{11}$ and $10A_{12}$ are maintained. If data needs to be written to memory cells $10A_{21}$ and $10A_{22}$ disposed on the other row (second row), the row wiring line control circuit 50A applies the voltage Vss to the enable signal line $EN_2$ and the row wiring line $ROW_2$ of the second row, and the column wiring line control circuit 60A applies the voltage Vss or the voltage Vdd to column wiring lines $COL_1$ and $COL_2$ to set values, and then the row wiring line control circuit 50A applies the voltage Vdd to the row wiring line $ROW_2$ and the enable signal line $EN_2$ to maintain the values.

(Value Fixing Write Operation)

A process of writing data to fix memory cell values so as not to cause soft errors will be described with reference to FIGS. 18 and 19. An example in which the value of the memory cell $10A_{11}$ is fixed to "1" (Vdd) and the value of the memory cell $10A_{21}$ is fixed to "0" (Vss) will be described.

A method of fixing the memory cell value to the voltage Vdd is first described. The fixing of the value to the voltage Vdd is performed row by row. Frist, the row wiring line control circuit 50A and the column wiring line control circuit 60A apply the voltage Vss to all of the wiring lines, specifically the column wiring lines $COL_1$ and $COL_2$, the row wiring lines $ROW_1$ and $ROW_2$, and the enable signal lines $EN_1$ and $EN_2$, to set the values of the connection line 12 and the connection line 14 within each of the memory cells $10A_{11}$ to $10A_{22}$ to be the voltage Vdd.

Figure 18:
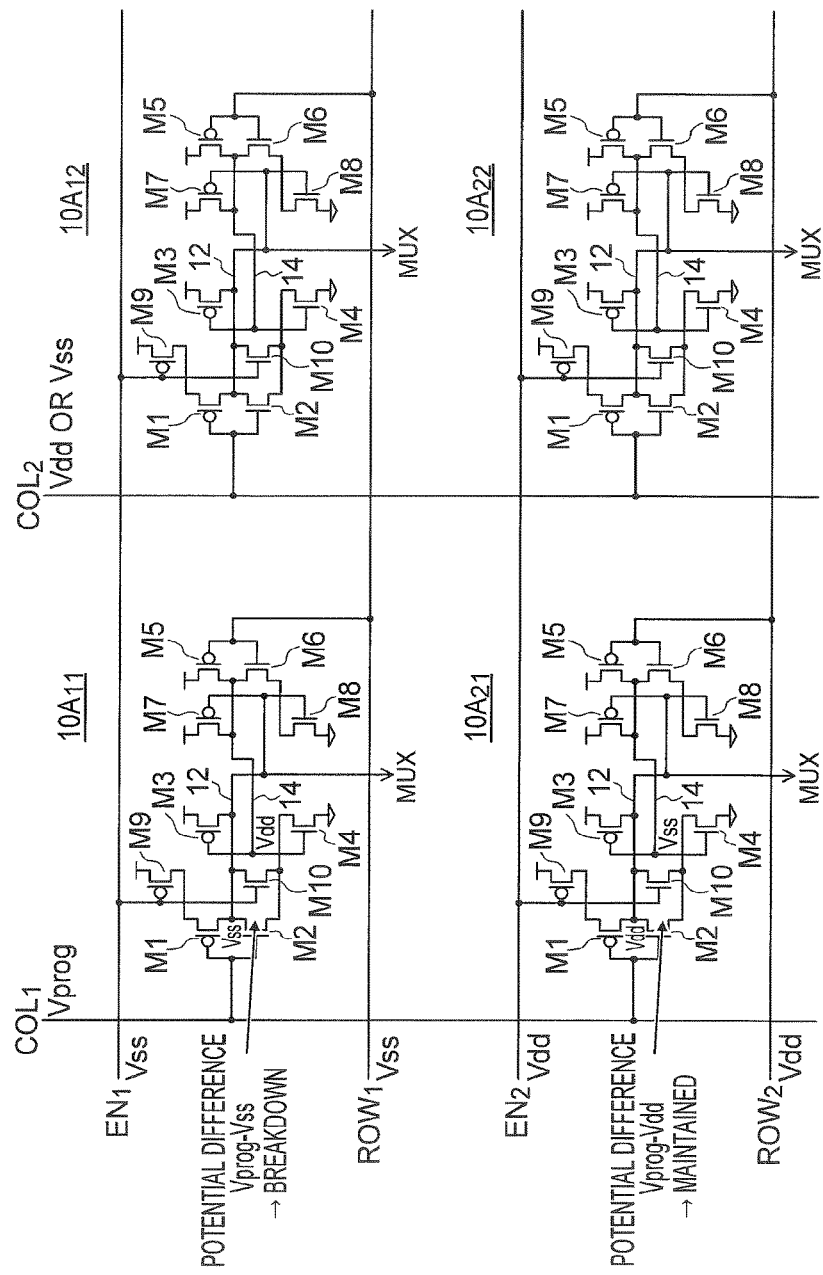
FIG. 18 is an explanatory diagram of a write method in which a memory cell value is fixed in the fourth embodiment.

Next, as shown in FIG. 18, the row wiring line control circuit 50A applies the voltage Vss to the enable signal line $EN_1$ and the row wiring line $ROW_1$ of the row (in this example, the first row) that includes the memory cell $10A_{11}$, the value of which is intended to be fixed to the voltage Vdd, of the selected column (in this example, the first column), and applies the voltage Vdd to the enable signal line $EN_2$ and the row wiring line $ROW_2$ of the non-selected row.

The column wiring line control circuit 60A then applies the voltage Vprog to the column wiring line $COL_1$ of the selected column (the first column), the voltage Vprog having a value that may break the gate insulating film, and applies the voltage Vdd or the voltage Vss to the column wiring line $COL_2$ of the non-selected column. As a result, a voltage Vprog–Vss is applied to the gate insulating film of the transistor M2 included in the memory cell $10A_{11}$, and a voltage Vprog–Vdd is applied to the gate insulating film of the transistor M2 included in the memory cell $10A_{21}$. Therefore, the gate insulating film of the transistor M2 included in the memory cell $10A_{11}$, to which a greater potential difference is applied, is first broken, and the gate insulating film of the transistor M2 included in the memory cell $10A_{21}$, to which a smaller potential difference is applied, is not broken and its insulating state of is maintained. This operation is performed for the respective columns to write data to the memory cells to which the value is fixed to the voltage Vdd.

It may be possible that, before the voltage Vprog is applied to the column wiring line $COL_1$, the voltage Vdd is applied to the column wiring line $COL_1$ to fix the value of the enable signal line $EN_1$ at the voltage Vdd, and then the voltage applied to the column wiring line $COL_1$ is raised to Vprog. As a result, the voltage Vdd is applied to the gate of the transistor M10 included in memory cell, which prevents the transistor M10 from being damaged by the write operation to write data to the transistor M2.

Next, a method of fixing the memory cell value to the voltage Vss is described. The fixing of the value to the voltage Vss is performed row by row. First, the row wiring line control circuit 50A and the column wiring line control circuit 60A apply the voltage Vss to all of the wiring lines, specifically the column wiring lines $COL_1$ and $COL_2$, the row wiring lines $ROW_1$ and $ROW_2$, and the enable signal lines $EN_1$ and $EN_2$, to set the values of the connection line 12 and the connection line 14 within each of the memory cells $10A_{11}$ to $10A_{22}$ to be the voltage Vdd.

Figure 19:
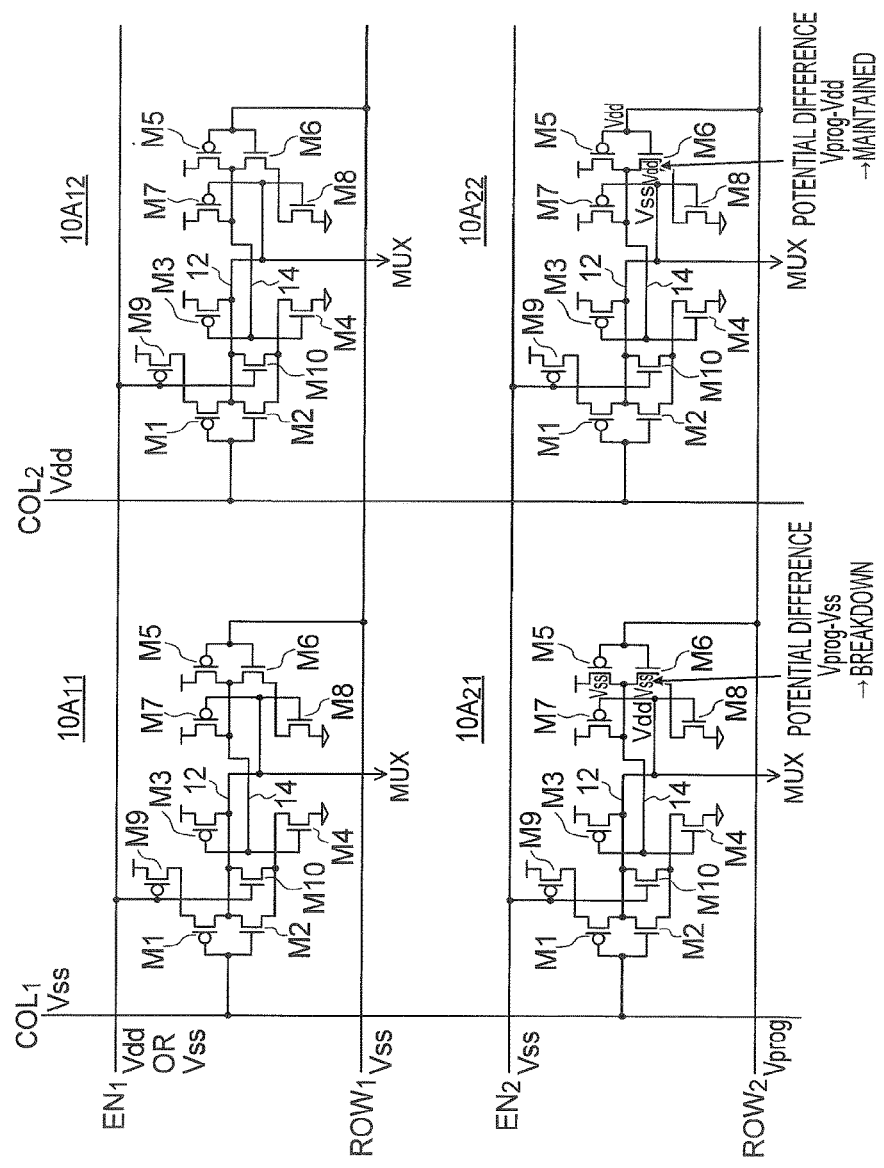
FIG. 19 is an explanatory diagram of a write method in which a memory cell value is fixed in the fourth embodiment.

Next, as shown in FIG. 19, the row wiring line control circuit 50A applies the voltage Vss to the enable signal $EN_2$ connecting to the selected row (in this example, the second row) that includes the memory cell $10A_{21}$, the value of which is intended to be fixed to the voltage Vss. The row wiring line control circuit 50A also applies the voltage Vdd or the voltage Vss to the enable signal line $EN_1$ and the row wiring line $ROW_1$ of the none-selected row. The column wiring line control circuit 60A then applies the voltage Vss to the column wiring line $COL_1$ of the selected column (in this example, the first column) including the memory cell $10A_{21}$, the value of which is intended to be fixed to the voltage Vss, and applies the voltage Vdd to the column wiring line $COL_2$ of the non-selected column. Thereafter, the row wiring line control circuit 50A applies the voltage Vprog to the row wiring line $ROW_2$ of the selected row (second row).

As a result, the voltage Vprog–Vss is applied to the gate insulating film of the transistor M6 included in the memory cell $10A_{21}$, and the voltage Vprog–Vdd is applied to the gate insulating film of the transistor M6 included in the memory cell $10A_{22}$. Therefore, the gate insulating film of the transistor M6 included in the memory cell $10A_{21}$, to which a greater potential difference is applied, is first broken, and the gate insulating film of the transistor M6 included in the memory cell $10A_{22}$, to which a smaller potential difference is applied, is not broken and the its insulating state is maintained. This operation is performed row by row to write data to the memory cells to which the value is fixed to the voltage Vss.

As described above, if the value of the selection line 12 in each memory cell is fixed to the voltage Vdd, the voltage Vprog is applied to the column wiring line COL, and if the value of the selection line 12 in each memory cell is fixed to the voltage Vss, the voltage Vprog is applied to the row wiring line ROW. The order of the fixing to Vdd and the fixing to Vss may be arbitrarily determined.

(Read Operation after Value Fixing Write Operation)

Figure 20:
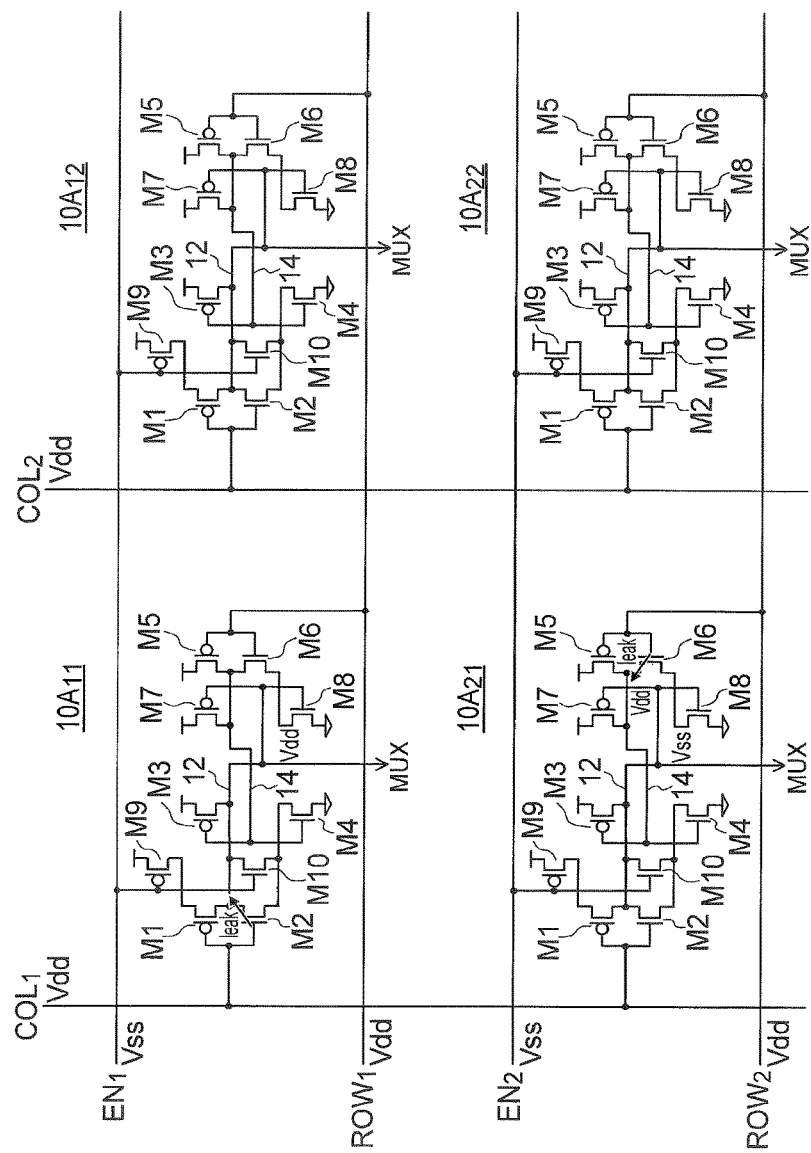
FIG. 20 is an explanatory diagram of a read operation performed after the value fixing write operation in the fourth embodiment.

A read operation that is performed after the write operation for fixing the memory cell value in the memory circuit according to the fourth embodiment will be described with reference to FIG. 20. The following descriptions are based on the example illustrated in FIGS. 18 and 19. The gate insulating film of the transistor M2 included in the memory cell $10A_{11}$ is broken, and the gate insulating film of the transistor M6 included in the memory cell $10A_{21}$ is broken.

After the memory value fixing write operation, data is read in the following manner. The row wiring line control circuit 50A applies the low-voltage-side power supply voltage Vss to the enable signal lines $EN_1$ and $EN_2$, and the high-voltage-side power supply voltage Vdd to the row wiring lines $ROW_1$ and $ROW_2$. The column wiring line control circuit 60A applies the voltage Vdd to the column wiring lines $COL_1$ and $COL_2$. Since the gate insulating film of the transistor M2 is broken in the memory cell $10A_{11}$, the voltage Vdd is conveyed through the gate insulating film of the transistor M2 and the connection line 12 is forcibly set at the voltage Vdd. Therefore, the output to the MUX circuit is fixed to the voltage Vdd. Similarly, the voltage Vdd applied to the gate insulating film of the transistor M6 included in the memory cell $10A_{21}$ is conveyed to the connection line 14. Therefore, in the connection line 12 and the connection line 14 that are cross-coupled with each other, the connection line 14 is forcibly set at the voltage Vdd. Since the voltage at the connection line 12 is fixed to the voltage Vss, the output to the MUX circuit is fixed to the voltage Vss. In this state, the value of the memory cell is determined by the voltage Vdd supplied from the column wiring lines $COL_1$ and $COL_2$ and the row wiring lines $ROW_1$ and $ROW_2$. Therefore, the value of the memory cell is not flipped by high-energy particles and noise in the fourth embodiment. Thus, a configuration memory circuit for FPGA that does not cause soft errors may be achieved.

If, in the initial state of each memory cell, the connection line 12 or the connection line 14 is set at the voltage Vss, the voltage Vdd needs to be supplied from the column wiring lines $COL_1$ and $COL_2$ or the row wiring lines $ROW_1$ and $ROW_2$ to the memory cell through the transistor M2 or the transistor M6 to change the value of the memory cell. In such a case, supplying the power supply voltage Vdd to the memory cell after supplying the voltage Vdd to the column wiring lines $COL_1$ and $COL_2$ or the row wiring lines $ROW_1$ and $ROW_2$ makes it easier to fix the value. The fixing of the value may also be helped by setting the voltage supplied from the column wiring lines $COL_1$ and $COL_2$ and the row wiring lines $ROW_1$ and $ROW_2$ to be higher than the voltage Vdd. The fixing of the value may also be helped by setting the channel width of the transistor M4 and the transistor M8 to be smaller than that of the other transistors, or a minimum width permitted by the design rule. A combination of these methods will also be helpful in fixing the value.

In the above description, the output of the memory cell according to the fourth embodiment is intended to connect to a multiplexer circuit. However, the output may not be limited to be connected to a multiplexer circuit but may be connected to other circuits. For example, as in a memory circuit 1B shown in FIG. 11, the memory cell $10_{ij}$ according to this embodiment may be connected to the gate of the switch transistor $18_{ij}$ (i, j=1, 2) disposed at each intersection region of the wiring lines $RL_1$, $RL_2$, $CL_1$, and $CL_2$ that are arrange in a crossbar form so as to form crossbar wiring lines.

Fifth Embodiment

Figure 21:
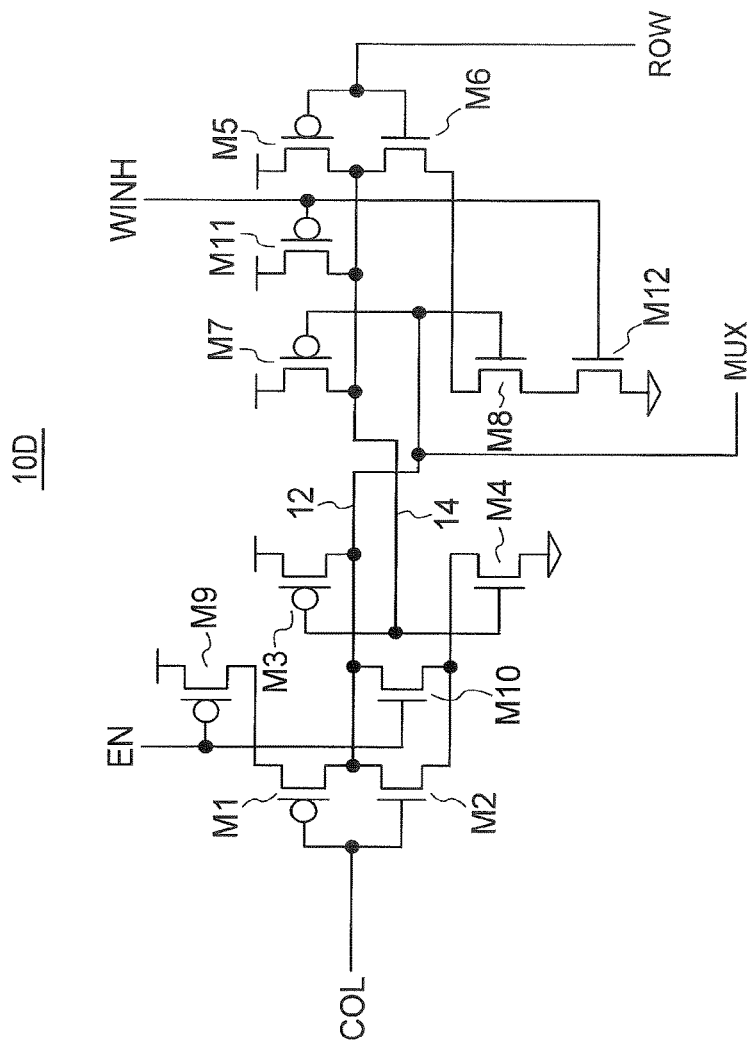
FIG. 21 is a circuit diagram illustrating a memory cell included in a memory circuit according to the fifth embodiment.

A configuration memory circuit ("memory circuit") according to a fifth embodiment will be described with reference to FIG. 21. The memory circuit according to the fifth embodiment is obtained by replacing the memory cells $10A_{11}$ to $10A_{22}$ of the memory circuit 1C according to the fourth embodiment shown in FIG. 16 with memory cells 10D shown in FIG. 21. The memory cell 10D according to the fifth embodiment is obtained by adding a p-channel transistor M11 and an n-channel transistor M12 to the memory cell 10C according to the fourth embodiment shown in FIG. 14. In the following descriptions, the p-channel MOS transistor and the n-channel MOS transistor may also be simply referred to as transistors.

The transistor M11 is connected in parallel with the transistors M5 and M7. Specifically, the drain terminal of the transistor M11 is connected to the drain terminal of the transistor M5 and the drain terminal of the transistor M7. The source terminal of the transistor M11 is connected to the high-voltage power supply Vdd. The transistor M12 is connected in series with the transistor M8. Specifically, the source terminal of the transistor M8 is connected to the drain terminal of the transistor M12. The source terminal of the transistor M12 is connected to the low-voltage power supply Vss.

The gate terminal of the transistor M11 and the gate terminal of the transistor M12 are connected to a write protection signal line WINH. If the memory cell 10D is used in the memory circuit shown in FIG. 16, the memory cell $10A_{11}$ and the memory cell $10A_{21}$ are connected to a common write protection signal line $WINH_1$, and the memory cell $10A_{12}$ and the memory cell $10A_{22}$ are connected to a common write protection signal line $WINH_2$, and the write protection signal lines $WINH_1$ and $WINH_2$ are connected to the column wiring line control circuit 60A.

One of the connection line 12 and the connection line 14 of the memory cell 10D is connected to a multiplexer (MUX) circuit to provide a memory value used in the switch block or the LUT circuit of the logic block in the FPGA (see FIG. 14).

If the value of the memory cell $10A_{12}$ is to be fixed to Vss in the example of the write operation shown in FIG. 19, the voltage Vdd is applied to the column wiring line $COL_1$ to which the non-selected memory cell $10A_{11}$ is connected. However, if the gate insulating film of the transistor M2 has been broken by the Vdd fixing operation, the voltage Vdd may be conveyed through the gate insulating film of the transistor M2 to the connection line 12. As a result, a protection voltage intended to prevent breakdown of the transistor M6 included in the memory cell $10A_{11}$ may not be adequately applied to the transistor M6. In such a case, a protection voltage may be provided by applying the voltage Vss to the write protection signal line WINH to turn on the transistor M11 and turn off the transistor M12.

If the FPGA is used in a rewritable manner, of if a read operation is performed after a value fixing write operation is performed on the FPGA, the high-voltage-side power supply voltage Vdd is applied to the write protection signal line WINH to turn off the transistor M11 and the turn on the transistor M12. The other operations are the same as those for the memory circuit according to the fourth embodiment. A configuration memory circuit for FPGA that does not cause soft errors may be achieved by using the memory cell 10D according to the fifth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A configuration memory circuit comprising:
   a first wiring line and a second wiring line;
   a first transistor having a first-conductive-type and including a drain terminal that is connected to the second wiring line, and a gate terminal that is connected to the first wiring line;
   a second transistor having a second-conductive-type and including a source terminal and a drain terminal, one of which is connected to the drain terminal of the first transistor, and a gate terminal that is connected to a third wiring line;
   a third transistor having the second-conductive-type and including a source terminal and a drain terminal, one of which is connected to the other of the source terminal and the drain terminal of the second transistor, and a gate terminal that is connected to the gate terminal of the first transistor and the first wiring line;
   a fourth transistor having the first-conductive-type and including a drain terminal that is connected to the first wiring line, and a gate terminal that is connected to the second wiring line;
   a fifth transistor having the second-conductive-type and including a source terminal and a drain terminal, one of which is connected to the drain terminal of the fourth transistor, and a gate terminal that is connected to the third wiring line;
   a sixth transistor having the second-conductive-type and including a source terminal and a drain terminal, one of which is connected to the other of the source terminal and the drain terminal of the fifth transistor, and a gate terminal that is connected to the gate terminal of the fourth transistor and the second wiring line;
   a seventh transistor having the second-conductive-type and including a source terminal and a drain terminal, one of which is connected to the gate terminal of the first transistor, the gate terminal of the third transistor, and the first wiring line, and the other of which is connected to a fourth wiring line, and a gate terminal that is connected to a fifth wiring line; and
   an eighth transistor having the second-conductive-type and including a source terminal and a drain terminal, one of which is connected to the gate terminal of the fourth transistor, the gate terminal of the sixth transistor, and the second wiring line, and the other of which is connected to a sixth wiring line, and a gate terminal that is connected to the fifth wiring line.

2. The configuration memory circuit according to claim 1, wherein in the second transistor, the source terminal and the drain terminal are connected to each other, and in the fifth transistor, the source terminal and the drain terminal are connected to each other.

3. The configuration memory circuit according to claim 1, wherein the configuration memory circuit outputs a potential of at least one of the first wiring line and the second wiring line.

4. The configuration memory circuit according to claim 1, further comprising:
   a ninth transistor having the first-conductive-type and connected to the third wiring line and including a gate insulating film that is thicker than gate insulating films of the first and fourth transistors and gate insulating films of the second, third, fifth, and sixth transistors; and a control circuit that supplies a first voltage to the fifth wiring line, a second voltage to the third wiring line via the ninth transistor, a third voltage to the fourth wiring line, and a fourth voltage to the sixth wiring line.

5. The configuration memory circuit according to claim 4, wherein the seventh transistor and the eighth transistor are turned on by applying the first voltage to the fifth wiring line, one of the third voltage and the fourth voltage is higher than the other, and the gate insulating film of one of the second transistor and the fifth transistor is broken by applying the second voltage to the third wiring line via the ninth transistor.

6. The configuration memory circuit according to claim 5, wherein a resistance value between the gate terminal and the one of the source terminal and the drain terminal of the second transistor differ by 10% or more from a resistance value between the gate terminal and the one of the source terminal and the drain terminal of the fifth transistor.

7. A configuration memory circuit comprising:
a first wiring line and a second wiring line;
a first transistor having a first-conductive-type and including a drain terminal that is connected to the first wiring line, and a gate terminal that is connected to a third wiring line;
a second transistor having a second-conductive-type and including a source terminal and a drain terminal, one of which is connected to the drain terminal of the first transistor and the first wiring line, and a gate terminal connected to the third wiring line;
a third transistor having the first-conductive-type and including a drain terminal that is connected to the first wiring line, the drain terminal of the first transistor, and the one of the source terminal and the drain terminal of the second transistor, and a gate terminal that is connected to the second wiring line;
a fourth transistor having the second-conductive-type and including a source terminal and a drain terminal, one of which is connected to the other of the source terminal and the drain terminal of the second transistor, and a gate terminal that is connected to the gate terminal of the third transistor and the second wiring line;
a fifth transistor having the first-conductive-type and including a drain terminal that is connected to the second wiring line and a gate terminal that is connected to a fourth wiring line;
a sixth transistor having the second-conductive-type and including a source terminal and a drain terminal, one of which is connected to the drain terminal of the fifth transistor and the second wiring line, and a gate terminal that is connected to the fourth wiring line;
a seventh transistor having the first-conductive-type and including a drain terminal that is connected to the second wiring line, the drain terminal of the fifth transistor, and the one of the source terminal and the drain terminal of the sixth transistor, and a gate terminal that is connected to the first wiring line;
an eighth transistor having the second-conductive-type and including a source terminal and a drain terminal, one of which is connected to the other of the source terminal and the drain terminal of the sixth transistor, and a gate terminal that is connected to the gate terminal of the seventh transistor and the first wiring line;
a ninth transistor having the first-conductive-type and including a drain terminal that is connected to a source terminal of the first transistor, and a gate terminal that is connected to a fifth wiring line; and a tenth transistor having the second-conductive-type and including a source terminal and a drain terminal, one of which is connected to the drain terminal of the first transistor, the one of the source terminal and the drain terminal of the second transistor, and the first wiring line, and the other of which is connected to the other of the source terminal and the drain terminal of the second transistor and the one of the source terminal and the drain terminal of the fourth transistor, and a gate terminal that is connected to the gate terminal of the ninth transistor and the fifth wiring line.

8. The configuration memory circuit according to claim 7, wherein the configuration memory circuit outputs a potential of at least one of the first wiring line and the second wiring line.

9. The configuration memory circuit according to claim 7, further comprising:
an eleventh transistor having the first-conductive-type and connected to the third wiring line, and including a gate insulating film that is thicker than gate insulating films of the first to tenth transistors;
a twelfth transistor having the second-conductive-type and connected to the third wiring line, and including a gate insulating film that is thicker than the gate insulating films of the first to tenth transistors;
a thirteenth transistor having the first-conductive-type and connected to the fourth wiring line, and including a gate insulating film that is thicker than the gate insulating films of the first to tenth transistors;
a fourteenth transistor having the second-conductive-type and connected to the fourth wiring line, and including a gate insulating film that is thicker than the gate insulating films of the first to tenth transistors; and
a control circuit that supplies a first voltage to the fifth wiring line, a second voltage to the third wiring line via the eleventh transistor and the twelfth transistor, and a third voltage to the fourth wiring line via the thirteenth transistor and the fourteenth transistor.

10. The configuration memory circuit according to claim 9, wherein the control circuit supplies a first potential to the third to fifth wiring lines, a second potential that is higher than the first potential to the first and second wiring lines, and a third potential that is higher than the second potential to one of the third wiring line and the fourth wiring line, to break down the gate insulating film of one of the second transistor and the sixth transistor.

11. The configuration memory circuit according to claim 10, wherein a resistance value between the gate terminal and the one of the source terminal and the drain terminal of the second transistor differ by 10% or more from a resistance value between the gate terminal and the one of the source terminal and the drain terminal of the sixth transistor.

12. A configuration memory circuit, comprising:
a first wiring line and a second wiring line;
a first transistor having a first-conductive-type and including a gate terminal that is connected to the first wiring line;
a first capacitor including a first terminal and a second terminal, the first terminal being connected to a drain terminal of the first transistor and the second terminal being connected to a third wiring line;
a second transistor having a second-conductive-type and including a source terminal and a drain terminal, one of which is connected to the first terminal of the first capacitor, and a gate terminal that is connected to the gate terminal of the first transistor and the first wiring line;

a third transistor having the first-conductive-type and including a gate terminal that is connected to the second wiring line;

a second capacitor including a third terminal and a fourth terminal, the third terminal being connected to a drain terminal of the third transistor, and the fourth terminal being connected to the third wiring line;

a fourth transistor having the second-conductive-type and including a source terminal and a drain terminal, one of which is connected to the third terminal of the second capacitor, and a gate terminal that is connected to the gate terminal of the third transistor and the second wiring line;

a fifth transistor having the second-conductive-type and including a source terminal and a drain terminal, one of which is connected to the gate terminal of the first transistor, the third terminal of the second capacitor, and the first wiring line and the other of which is connected to a fourth wiring line, and a gate terminal that is connected to a fifth wiring line; and a sixth transistor having the second-conductive-type and including a source terminal and a drain terminal, one of which is connected to the gate terminal of the third transistor, the first terminal of the first capacitor, and the second wiring line and the other of which is connected to a sixth wiring line, and a gate terminal that is connected to the fifth wiring line.

\* \* \* \* \*